United States Patent
Matsumoto et al.

(10) Patent No.: US 7,400,687 B2
(45) Date of Patent: Jul. 15, 2008

(54) MULTICARRIER COMMUNICATION APPARATUS AND MULTICARRIER COMMUNICATION METHOD

(75) Inventors: Atsushi Matsumoto, Kanazawa (JP); Kenichi Miyoshi, Yokohama (JP)

(73) Assignee: Matsushita Electric Industrial Co., Ltd, Osaka (JP)

(*) Notice: Subject to any disclaimer, the term of this patent is extended or adjusted under 35 U.S.C. 154(b) by 650 days.

(21) Appl. No.: 10/481,783

(22) PCT Filed: Apr. 10, 2003

(86) PCT No.: PCT/JP03/04542

§ 371 (c)(1),
(2), (4) Date: Dec. 23, 2003

(87) PCT Pub. No.: WO03/088537

PCT Pub. Date: Oct. 23, 2003

(65) Prior Publication Data

US 2004/0199846 A1  Oct. 7, 2004

(30) Foreign Application Priority Data

Apr. 12, 2002 (JP) ............... 2002-111171
Sep. 19, 2002 (JP) ............... 2002-273569

(51) Int. Cl.
*H04L 27/28* (2006.01)
(52) U.S. Cl. ............... 375/260
(58) Field of Classification Search ........... 375/259, 375/260, 286, 299, 295
See application file for complete search history.

(56) References Cited

U.S. PATENT DOCUMENTS

| | | | |
|---|---|---|---|
| 2002/0199147 A1* | 12/2002 | Kim et al. | 714/748 |
| 2003/0031233 A1* | 2/2003 | Kim et al. | 375/146 |
| 2003/0039229 A1* | 2/2003 | Ostman | 370/335 |

FOREIGN PATENT DOCUMENTS

| | | |
|---|---|---|
| EP | 1011245 | 6/2000 |
| EP | 1043858 | 10/2000 |
| EP | 1124344 | 8/2001 |
| EP | 1126647 A1 * | 8/2001 |
| JP | 200031944 | 1/2000 |
| JP | 2000201132 | 7/2000 |
| JP | 2000269929 | 9/2000 |
| JP | 200160934 | 3/2001 |

OTHER PUBLICATIONS

Japanese Office Action dated Mar. 15, 2005 with English translation.

(Continued)

*Primary Examiner*—Kevin M Burd
(74) *Attorney, Agent, or Firm*—Dickinson Wright, PLLC

(57) ABSTRACT

A sequence converting section 104 interchanges high-order bits where an error does not easily occur and low-order bits where an error easily occurs that are used by an M-ary modulating section 105 for each retransmission. The M-ary modulating section 105 performs M-ary modulation using the high-order bits and low-order bits interchanged for each retransmission. An M-ary modulated symbol is interleaved with an interleave pattern being different for each retransmission, and multicarrier transmitted via an OFDM transmitting section 109.

5 Claims, 19 Drawing Sheets

OTHER PUBLICATIONS

Nguyen, et al., "OFDM Transmission System for MIMO," The University of Electro-Communications, Proceedings of the 2002 Communication Society Conference of IEICE 1, Japan, The Institute of Electronics, Information and Communication Engineers, p. 360, Aug. 20, 2002, with partial English translation.

PCT International Search Report dated May 27, 2003.

"Enhanced HARQ Method with Signal Constellation Rearrangement", 3GPP, TSG-RAN Working Group 1 Meeting #19 TSGR#19 (01) 0237, Mar. 2, 2001, pp. 1-11.

Japanese Office Action dated Aug. 28, 2007 with English translation.

* cited by examiner

BIT SEQUENCE=S0,S1,S2,S3

MULTICARRIER COMMUNICATION APPARATUS AND MULTICARRIER COMMUNICATION METHOD

TECHNICAL FIELD

The present invention relates to a multicarrier communication apparatus and multicarrier communication method that adopts a retransmission technique to improve an error rate.

BACKGROUND ART

Conventionally, there is proposed a multicarrier communication system that combines a packet obtained at initial transmission with a retransmitted packet to decode, thereby improving an error rate characteristic caused at a decoding time on a receiving side. Then, conventionally, for the purpose of improving the throughput of data, various kinds of contrivances have been proposed to achieve a desired error rate with a small number of retransmissions.

Particularly, in the multicarrier communication system, a reception level differs for each subcarrier because of frequency-selective fading. Accordingly, the reception level of a signal on which a subcarrier with a certain frequency is superimposed becomes high but the reception level of the signal on which another subcarrier is superimposed becomes low. As a result, the error rate of the signal on which a subcarrier with a low reception level does not easily achieve a desired value, so that the number of retransmissions increases.

In consideration of this point, there are methods disclosed in Unexamined Japanese Patent Publication Nos. 2001-60934 and 2000-269929. In these methods, an interleave pattern is changed for each retransmission to vary a subcarrier that locates a symbol for each retransmission. As a result, the signal level of each symbol can be unified at a packet combining time to make it possible to improve the error rate characteristic.

By the way, according to the conventionally proposed method that changes the interleave pattern for each retransmission, since variations in transmission symbols can be, indeed, made greater by interleave processing, a symbol with an extremely low error rate can be reduced to enable to improve the throughput of data effectively.

However, in recent years, it has been demanded that a large capacity of data such as image data is transmitted at high speed, and in order to achieve this, it is needed to further improve the error rate characteristic to reduce the number of retransmission times, thereby much more improving the throughput.

DISCLOSURE OF INVENTION

An object of the present invention is to more increase improvement effect of an error rate characteristic by retransmission to improve a throughput characteristic in multicarrier communications.

This object can be attained by interchanging high-order bits where an error easily occurs and low-order bits where an error does not easily occur for each retransmission to provide M-ary modulation when M-ary modulation is provided to transmission data to perform multicarrier transmission to a modulated symbol. Moreover, bit interleave processing is performed such that bits forming M-ary modulated one symbol differ for each retransmission, thereby making it possible to further improve the throughput characteristic.

In other words, even if the reception level of the same symbol reduces at the previous transmission and the next transmission (retransmission), this enables to reduce a probability that the reception level of the same bit will continuously become small to improve time diversity effect by retransmission on the receiving side. As a result, since the error rate characteristic after packet combining on the receiving side can be improved, it is possible to reduce the number of times of retransmissions and improve the throughput of data.

BEST MODE FOR CARRYING OUT THE INVENTION

The following will specifically explain embodiments of the present invention with reference to the accompanying drawings.

Embodiment 1

Figure 1:
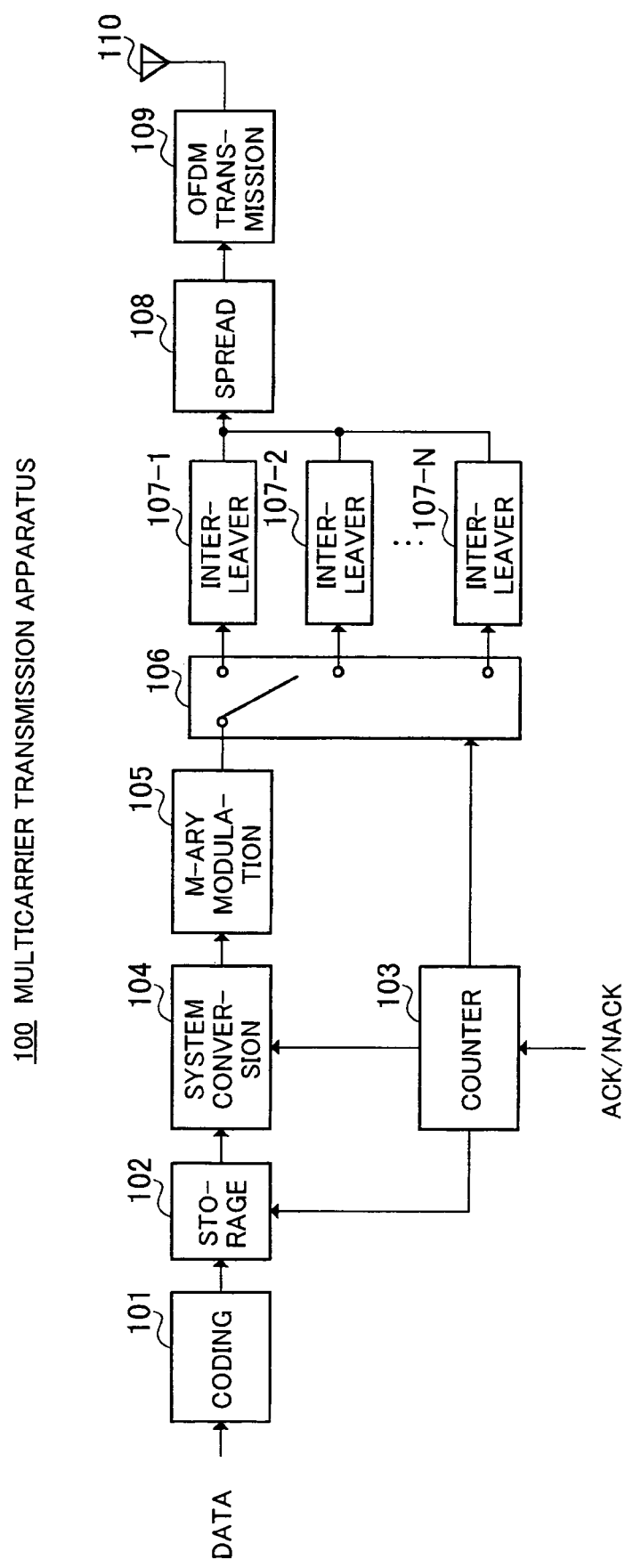
FIG. 1 is a block diagram illustrating a configuration of a multicarrier transmitting apparatus according to Embodiment 1 of the present invention.

In FIG. 1, 100 indicates a configuration of a multicarrier transmitting apparatus as a whole according to Embodiment 1 of the present invention. The multicarrier transmitting apparatus 100 is used as a transmission system of a multicarrier communication apparatus according to the present invention.

The multicarrier transmitting apparatus 100 is provided in a radio base station apparatus and a communication terminal apparatus.

The multicarrier transmitting apparatus 100 performs M-ary modulation processing to transmission data, performs spread processing to a symbol obtained by modulation, superimposes a chip obtained by spreading on a plurality of subcarriers orthogonal to each other, and transmits it. Namely, the multicarrier transmitting apparatus 100 in this Embodiment sends transmission data by OFDM (Orthogonal Frequency Division Multiplexing)—CDMA (Code Division Multiple Access).

The multicarrier transmitting apparatus 100 codes transmission data using a coding section 101 and sends the coded data to a storage section 102. The storage section 102 is read and controlled based on a count value of a counter 103. Here, the counter 103 increments the count value every time when a NACK signal (repeat request signal) is sent from a receiving side, and resets the count value to 0 when an ACK signal is sent. The storage section 102 sends data stored every time when the count value is incremented to the sequence converting section 104 (namely, retransmission data is transmitted). On the other hand, when the count value becomes 0, data from the coding section 101 is directly transmitted to the sequence converting section 104 (namely, initial transmission data is transmitted).

The sequence converting section 104 interchanges the order of high-order bits where an error does not easily occur and low-order bits where an error easily occurs, both which are modulated by a next M-ary modulating section 105, every time when the count value from the counter 103 is incremented.

The M-ary modulating section 105 modulates a plurality of bits of data input from the sequence converting section 104 to one symbol. In this embodiment, the M-ary modulating section 105 performs 16 QAM (Quadrature Amplitude Modulation) to the input data to modulate four bits to one symbol.

Figure 2:
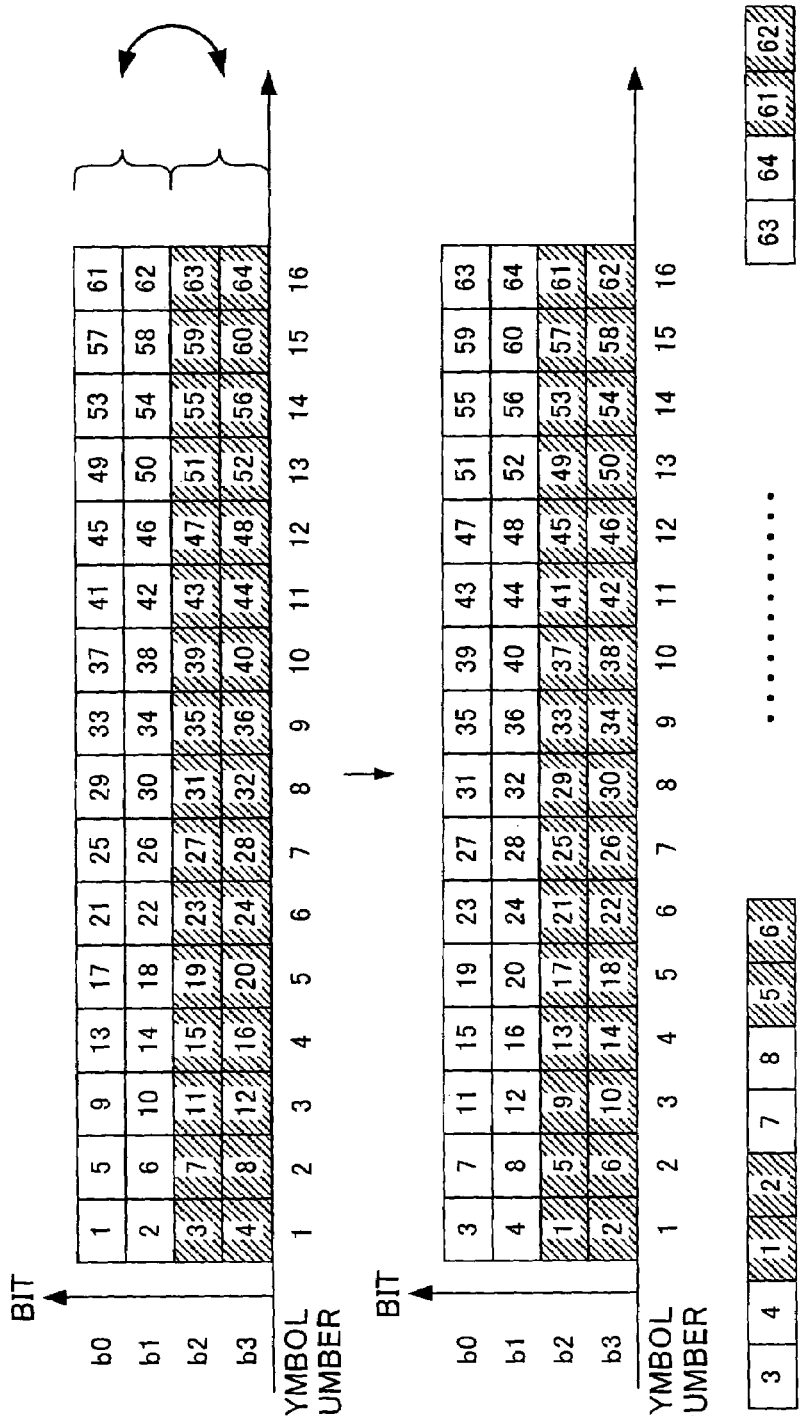
FIG. 2(A) is a view illustrating an array of bits input to a sequence converting section.
FIG. 2(B) is a view illustrating an array of bits forming each symbol at an initial transmitting time.
FIG. 2(C) is a view illustrating an array of bits forming each symbol at a retransmitting time (first retransmitting time)
FIG. 2(D) is a view illustrating an array of bits output from a sequence converting section at a retransmitting time (first retransmitting time)

An explanation will be next given of processing of the sequence converting section 104 and that of the M-ary modulating section 105 using FIG. 2. Here, FIG. 2(A) is a view illustrating an array of bits input to the sequence converting section 104. FIG. 2(B) is a view illustrating an array of bits forming each symbol at an initial transmitting time. FIG. 2(C) is a view illustrating an array of bits forming each symbol at a retransmitting time (first retransmitting time). FIG. 2(D) is a view illustrating an array of bits output from the sequence converting section 104 at a retransmitting time (first retransmitting time).

Here, in FIGS. 2(B) and 2(C), b0 and b1 show high-order bits where an error does not easily occur when being 16 QAM modulated and b2 and b3 show low-order bits where an error easily occurs. As is obvious from FIG. 2, the high-order bits and low-order bits are interchanged by the sequence converting section 104 at the initial transmitting time and the retransmitting time. Referring to, for example, symbol No. 1., bits 1 and 2 are placed as high-order bits and bits 3 and 4 are placed as low-order bits at the initial transmitting time (FIG. 2(B)), while bits 3 and 4 are placed as high-order bits and bits 1 and 2 are placed as low-order bits at the retransmitting time (FIG. 2(C)).

The M-ary modulated symbol is input to a selection circuit 106. A plurality of interleavers 107-1, 107-2, ... 107-N, each having a different interleave pattern, is connected to an output side of the selection circuit 106. The selection circuit 106 selects interleavers 107-1, 107-2, ... 107-N to have the modulated symbol inputted according to the count value from the counter 103. Accordingly, symbols, each having a different array order for each retransmission, are sent to a spreading section 108.

The spreading section 108 multiplies the input symbol by a spreading code and thereby spreads the symbol to a chip unit. An OFDM transmitting section 109 includes an IFFT (Inverse Fast Fourier Transform circuit) and a radio transmitting circuit, and superimposes a plurality of subcarriers orthogonal to each other on a chip obtained by spreading. A signal subjected to OFDM transmission processing is transmitted through an antenna 110.

Figure 3:
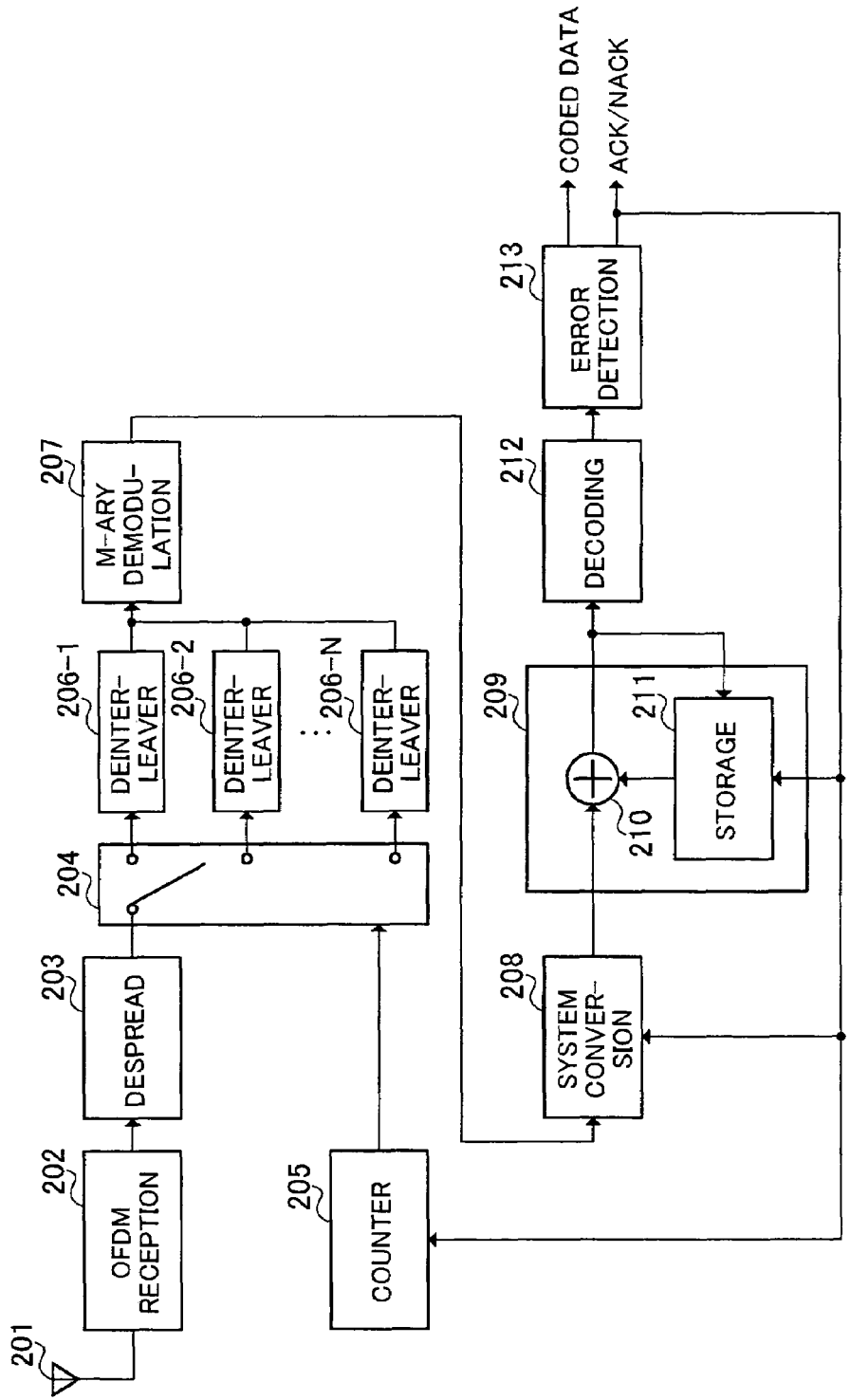
FIG. 3 is a block diagram illustrating a configuration of a multicarrier receiving apparatus of Embodiment 1.

FIG. 3 shows a configuration of a multicarrier receiving apparatus 200 that receives a multicarrier signal transmitted from the multicarrier transmitting apparatus 100. The multicarrier receiving apparatus 200 is used as a receiving system of the multicarrier communication apparatus of the present invention. The multicarrier receiving apparatus 200 inputs a received signal to an OFDM receiving section 202 through an antenna 201.

The OFDM receiving section 202 includes a radio receiving section and an FFT (Fast Fourier transform circuit), and extracts each chip superimposed on the plurality of subcarriers. A despreading section 203 despreads an input signal using a spreading code, so that an unspread symbol is restored and the restored symbol is transmitted to a selection circuit 204.

A plurality of deinterleavers 206-1, 206-2, ... 206-N, each having a different deinterleave pattern, is connected to an output side of the selection circuit 204. Each of deinterleavers 206-1, 206-2, ... 206-N returns each symbol to the original array by performing reverse processing of the interleavers 107-1, 107-2, ... 107-N (FIG. 1) on the transmitting side.

The selection circuit 204 selects the deinterleavers 206-1, 206-2, ... 206-N to have an input signal outputted according to a count value from a counter 205. Here, the counter 205 is incremented every time when a NACK signal is input similar to the counter 103 on the transmitting side (FIG. 1). In other words, between the multicarrier transmitting apparatus 100 and the multicarrier receiving apparatus 200, the interleavers 107-1, 107-2, ... 107-N (FIG. 1) and the deinterleavers 206-1, 206-2, . . . 206-N are selected according to the number of retransmissions, so that the array of symbol is returned to the original by the deinterleavers 206-1, 206-2, . . . 206-N.

The symbol returned to the original array by the deinterleavers 206-1, 206-2, . . . 206-N is input to an M-ary demodulating section 207. The M-ary demodulating section 207 performs demodulation processing corresponding to the M-ary modulating section 105 (FIG. 1) to demodulate four-bit data from one symbol.

A sequence converting section 208 performs sequence conversion that is reverse to the sequence converting section 104 (FIG. 1) on the transmitting side according to the number of retransmissions. More specifically, the input bits are directly output with the array unchanged at the time of receiving the initially transmitted data, while the arrays of the high-order bits and low-order bits are interchanged for each retransmission when the retransmitted signal is received. Consequently, the signal with the same bit array as the transmitted data can be obtained. An output of the sequence converting section 208 is input to a combining circuit 209 that combines retransmitted packets.

The combining circuit 209 includes a storage section 211 and an adding section 210, and packet data stored in the storage section 211 up to the current retransmission and currently retransmitted packet data are added by an adding section 210. For example, when currently input packet data is packet data at a second retransmission, combined packet data, including data stored in the storage section 211 at the initial transmission and data at the first retransmission, is combined with currently retransmitted packet data.

Combined packet data is decoded by a decoding section 212 and an error detecting section 213 perform error detection such as CRC (Cyclic Redundancy Check). Accordingly, decoded data is output from the error detecting section 213 and an ACK signal is output when CRC is OK and a NACK signal is output when CRC is NG. ACK/NACK signals are sent to the counter 205 and also to the multicarrier transmitting apparatus 100 (FIG. 1).

An explanation will be next given of an operation of this embodiment. In this embodiment, the high-order bits and low-order bits at an M-ary modulation time are interchanged by the multicarrier transmitting apparatus 100 for each retransmission to make it possible to improve an error rate in bit unit on the receiving side. First of all, this will be explained using FIGS. 4, 5, and 6.

Figure 4:
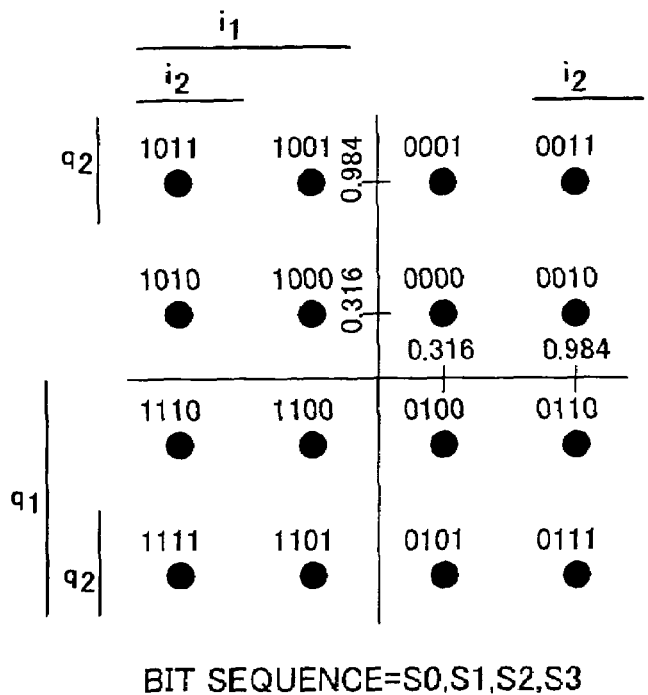
FIG. 4 is a view showing an explanation of 16 QAM mapping and a determination threshold value at a demodulating time.

FIG. 4 shows a mapping position on an I-Q plane of each symbol by 16 QAM. At the time of demodulation, regarding the high-order two bits, a decision threshold value with a width i1 in the figure is used as an in-phase component and a decision threshold value with a width q1 in the figure as a quadrature component, and soft decision processing is performed. On the other hand, regarding the low-order two bits, a decision threshold value with a width i2 is used as an in-phase component and a decision threshold value with a width q2 is used as a quadrature component, and soft decision processing is performed. As is obvious from the figure, since widths i2 and q2 of the decision threshold values of the low-order two bits are narrower than widths i1 and q1 of the decision threshold values of the high-order two bits, an error easily occurs as compared with the high-order two bits when symbol phase and amplitude are varied by a propagation path.

Figure 5:
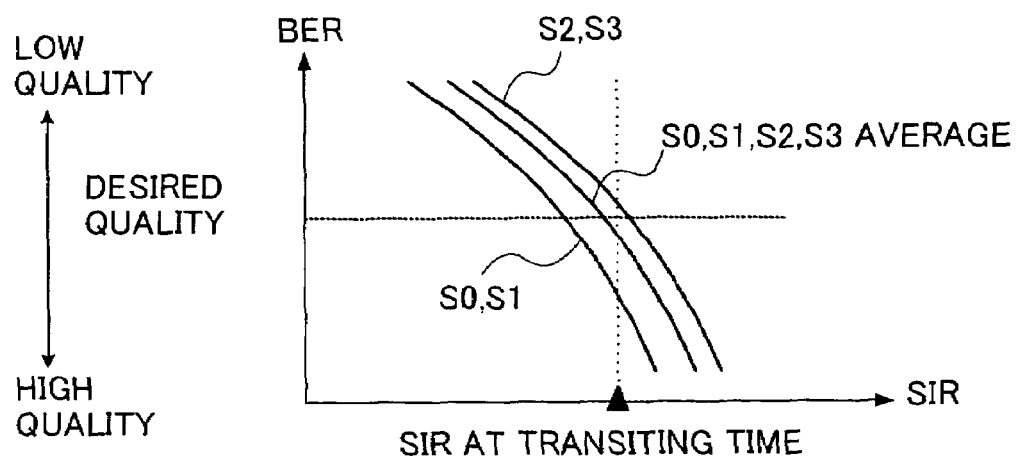
FIG. 5 is a view showing an explanation of the quality of high-order bits and that of low-order bits.

FIG. 5 shows a relationship between SIR (Signal to Interference Ratio) and BER (Bit Error Rate) in connection with the high-order two bits S0, S1 and the low-order two bits S2, S3. As is obvious from the figure, the high-order two bits have lower BER when the same SIR is given.

Figure 6:
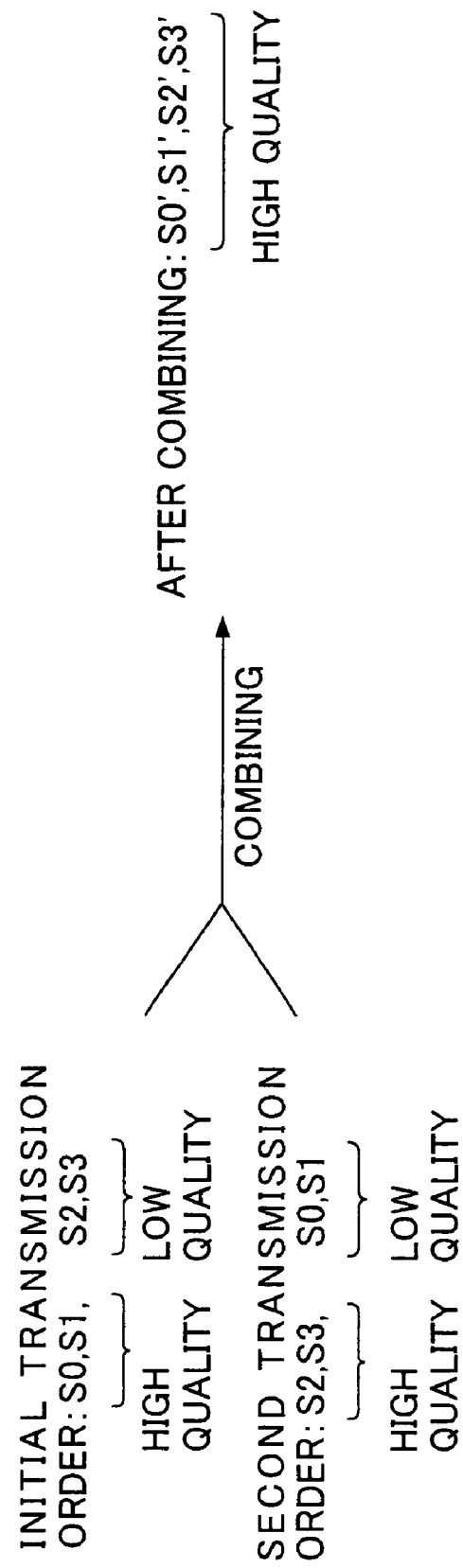
FIG. 6 is a view showing an explanation of an effect of Embodiment 1.

According to this embodiment, as illustrated in FIG. 6, bits S0 and S1 are transmitted as high-order bits with high quality at an initial transmitting time and bits S2 and S3 are transmitted as high-order bits with high quality at a second transmitting time (retransmitting time). This makes it possible to restore all bits S0', S1', S2' and S3' having such quality that causes no error when packet combining is performed on the receiving side.

In other words, time diversity effect can be obtained in bit unit by retransmission and an error rate characteristic of combined packet data can be improved as compared with the case in which bits transmitted as low-order bits at the initial transmitting time are transmitted as low-order bits at the retransmitting time.

Moreover, in this embodiment, since the M-ary modulated symbols are interleaved with interleave patterns each being different for each retransmission to perform multicarrier transmission, it can be expected that the error rate characteristic will be improved in symbol unit. In other words, even if a signal level of a specific subcarrier drops by frequency-selective fading, since there is a low probability that the same symbol will be continuously allocated to the subcarrier, time diversity effect can be obtained in bit unit by retransmission and the error rate characteristic of combined packet data can be further improved.

According to the aforementioned configuration, in a case where M-ary modulation is performed to transmission data and multicarrier transmission is performed to the modulated symbol, the high-order bits and low-order bits are interchanged for each transmission to perform M-ary modulation, thereby enabling to obtain time diversity effect by retransmission in connection with each bit and improve the error rate characteristic of combined packet data. As a result, the number of retransmissions can be reduced to make it possible to improve the throughput of data.

Embodiment 2

In this embodiment, in addition to the fact that the high-order bits and low-order bits are interchanged for each retransmission to perform M-ary modulation similar to Embodiment 1, bits, which are allocated to high-order bits, and bits, which are allocated to low-order bits, are divided at the time of M-ary modulation, and the respective divided bit sequences are interleaved using interleave patterns each being different for each retransmission.

As a result, in addition to the fact that the high-order bits and low-order bits are interchanged for each retransmission, bits forming one symbol due to M-ary modulation are also interchanged for each retransmission. Since this makes it possible to further vary each bit (namely, upon every retransmission, reduce a probability that the same bit is located on the same subcarrier) seeing between the retransmissions, time diversity effect by retransmission can be further increased in connection with each bit.

Figure 7:
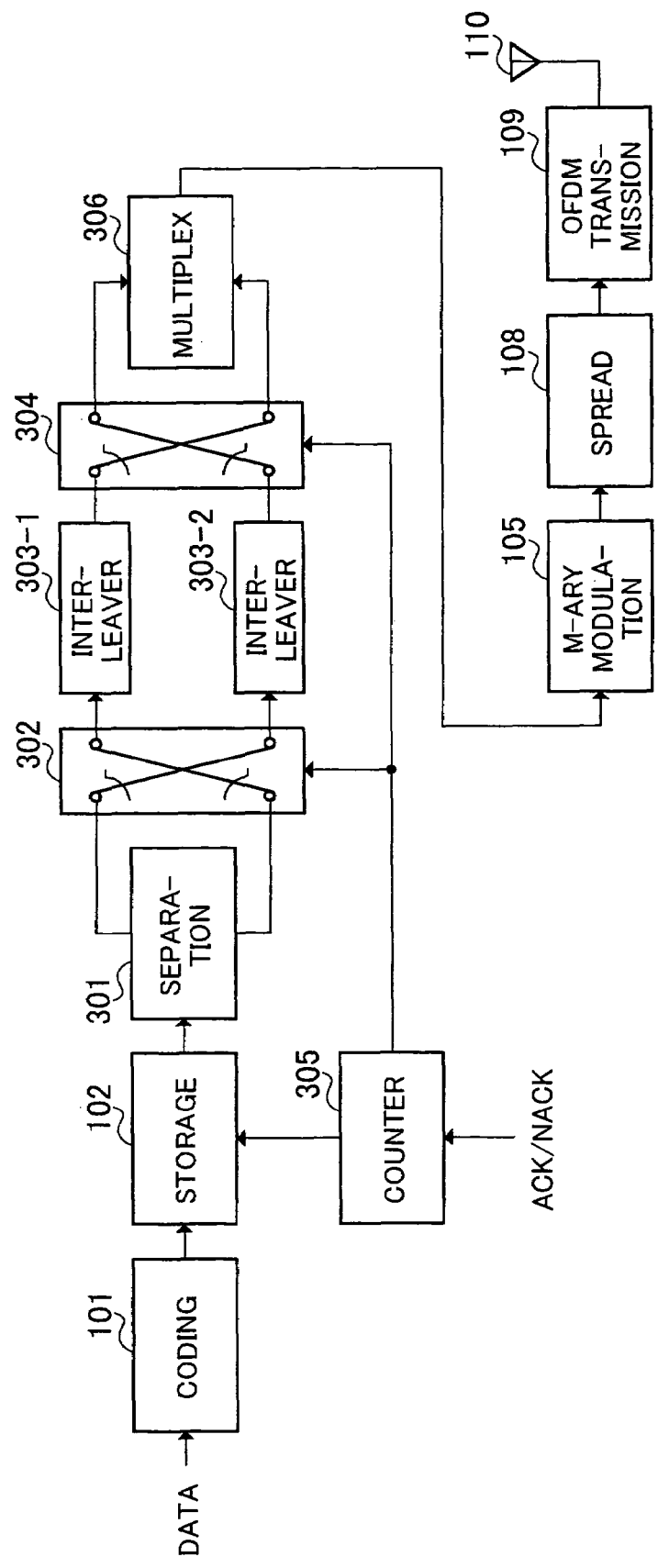
FIG. 7 is a block diagram illustrating a configuration of a multicarrier transmitting apparatus according to Embodiment 2.
Figure 8:
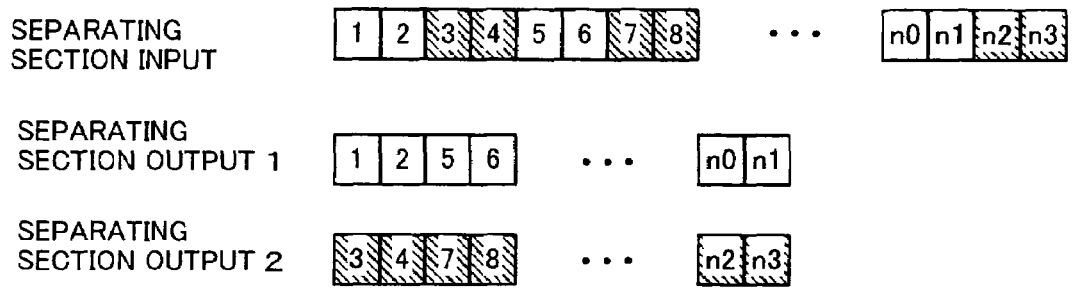
FIG. 8 is a view showing an explanation of data input/output to/from a separating section.

In FIG. 7 shown by adding the same reference numerals as those of FIG. 1 to the portions corresponding to FIG. 1, a multicarrier transmitting apparatus 300 of this embodiment separates transmission bits output from the storage section 102 using a separating section 301. In this embodiment, since 16 QAM where four bits are used as one symbol is performed, input bits are separated by every two bits. More specifically, as illustrated in FIG. 8, the separating section 301 separates the input bits to a separating section output 1 and a separating output section 2 every two bits, and supplies them to the input terminals of a following selection circuit 302, respectively.

Output terminals of the selection circuit 302 are connected to interleavers 303-1 and 302-2, respectively, each having a different interleave pattern, through a movable contact. The selection circuit 302 performs selection of the interleavers 303-1 and 302-2 that supply an input bit sequence according to a count value (namely, the number of retransmissions) from a counter 305. For example, at an initial transmitting time, the separating section output 1 shown in FIG. 8 is supplied to the interleaver 303-1 and the separating section output 2 is supplied to the interleaver 303-2. While, at a first retransmitting time, the separating section output 1 is supplied to the interleaver 303-2 and the separating section output 2 is supplied to the interleaver 303-1.

Outputs of the interleavers 303-1 and 302-2 are supplied to the input terminals of a following selection circuit 304, respectively. Output terminals of the selection circuit 304 are connected to two input terminals of a multiplexing section 306 through a movable contact, respectively. The selection circuit 304 performs selection of input terminals of the multiplexing section 306 that supplies the outputs of the interleavers 303-1 and 302-2 according to a count value (namely, the number of retransmissions) from the counter 305.

Here, the multiplexing section 306 time multiplexes bit sequences of two systems input from the two input terminals, thereby converting them to one bit sequence to output it. At this time, bits are alternately selected by two bits and output such that the two bits supplied to the first input terminal are first output and the two bits supplied to the second input terminal are next output.

Figure 9:
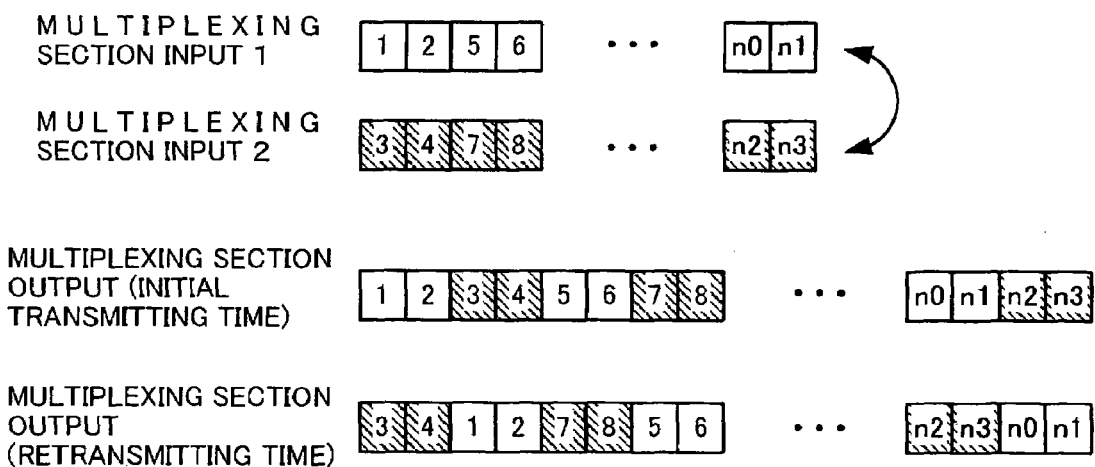
FIG. 9 is a view showing an explanation of data input/output to/from a multiplexing section.

An explanation will be given of the input and output states of the multiplexing section 306 using FIG. 9. At the first transmitting time, 1, 2, 5, 6, . . . , n0, and n1 as multiplexing section inputs 1 are input to the first input terminal and 3, 4, 7, 8, n2, and n3 as multiplexing section inputs 2 are input to the second input terminal. At this time, the multiplexing section 306 outputs a bit sequence including 1, 2, 3, 4, 5, 6, 7, 8, . . . , n0, n1, n2 and n3 in order as multiplexing section outputs.

While, although not illustrated, at the retransmitting time, 3, 4, 7, 8, . . . , n2 and n3 as multiplexing section inputs 1 are input to the first input terminal, and 1, 2, 5, 6, . . . , n0 and n1 as multiplexing section inputs 2 are input to the second input terminal. At this time, the multiplexing section 306 outputs a bit sequence including 3, 4, 1, 2, 7, 8, 5, 6, . . . , n2, n3, n0 and n1 in order as multiplexing section outputs (additionally, in FIG. 9, though the bit array that ignores interleave processing using the interleavers 303-1 and 302-2 is used in order to simplify the explanation, each bit is actually interleaved).

This enables the M-ary modulating section 105 to perform M-ary modulation processing in which the high-order bits and low-order bits are interchanged at the initial transmitting time and the retransmitting time, resulting in obtaining the same effect as Embodiment 1 that can prevent the reception quality of the low-order bits from being continuously degraded.

Figure 10:
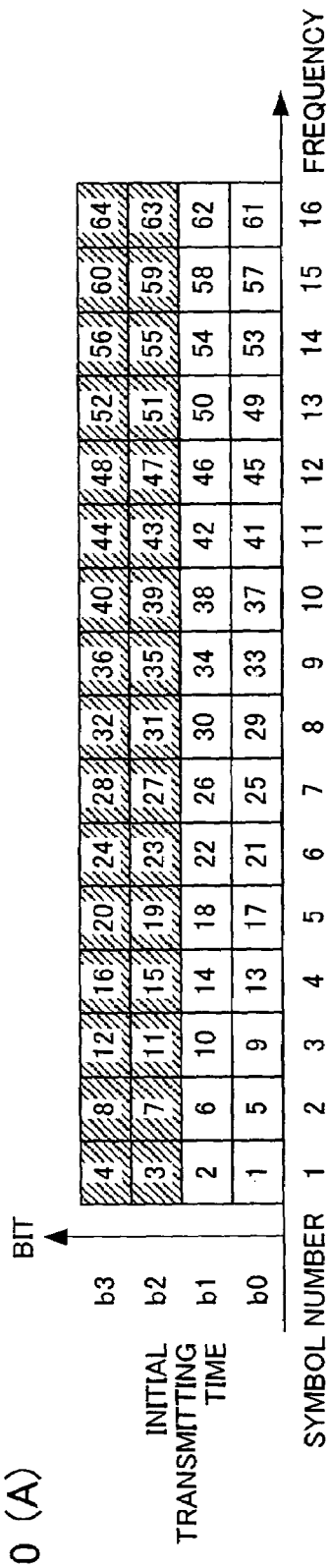
FIG. 10(A) is a view illustrating a bit array of a signal output from a multiplexing section at an initial transmitting time.
FIG. 10(B) is a view illustrating a bit array of a signal output from a multiplexing section at a retransmitting time.
Figure 10:
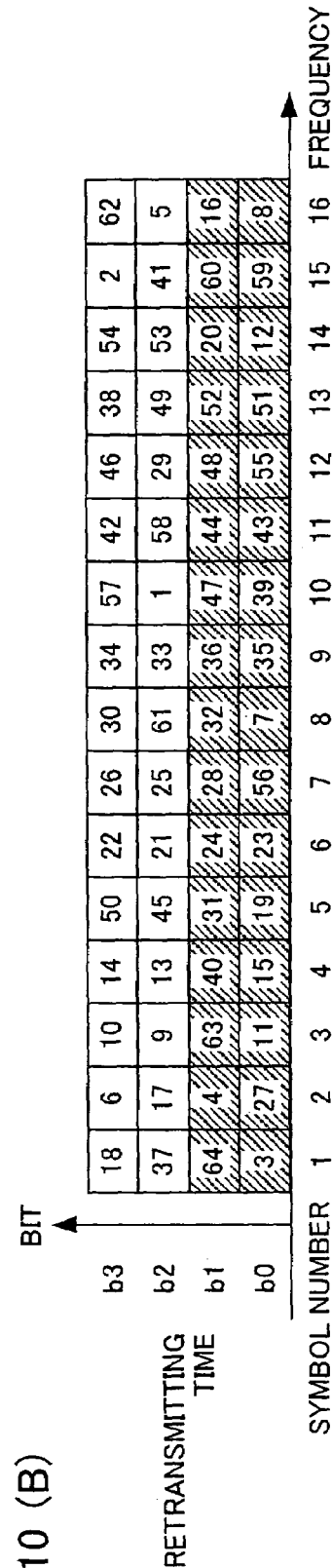

FIG. 10 illustrates the array of bits that are actually output from the multiplexing section 306. As is obvious from the figure, at an initial transmitting time shown in FIG. 10(A) and a retransmitting time shown in FIG. 10(B), bits to be allocated to each symbol are also interchanged in addition to the fact that the high-order bits and low-order bits are interchanged. As a result, for example, even when each symbol is allocated to the same subcarrier at the initial transmitting time and the retransmitting time, each bit is placed on the different subcarrier at the initial transmitting time and the retransmitting time, enabling to surely obtain time diversity effect by retransmission in connection with each bit.

Figure 11:
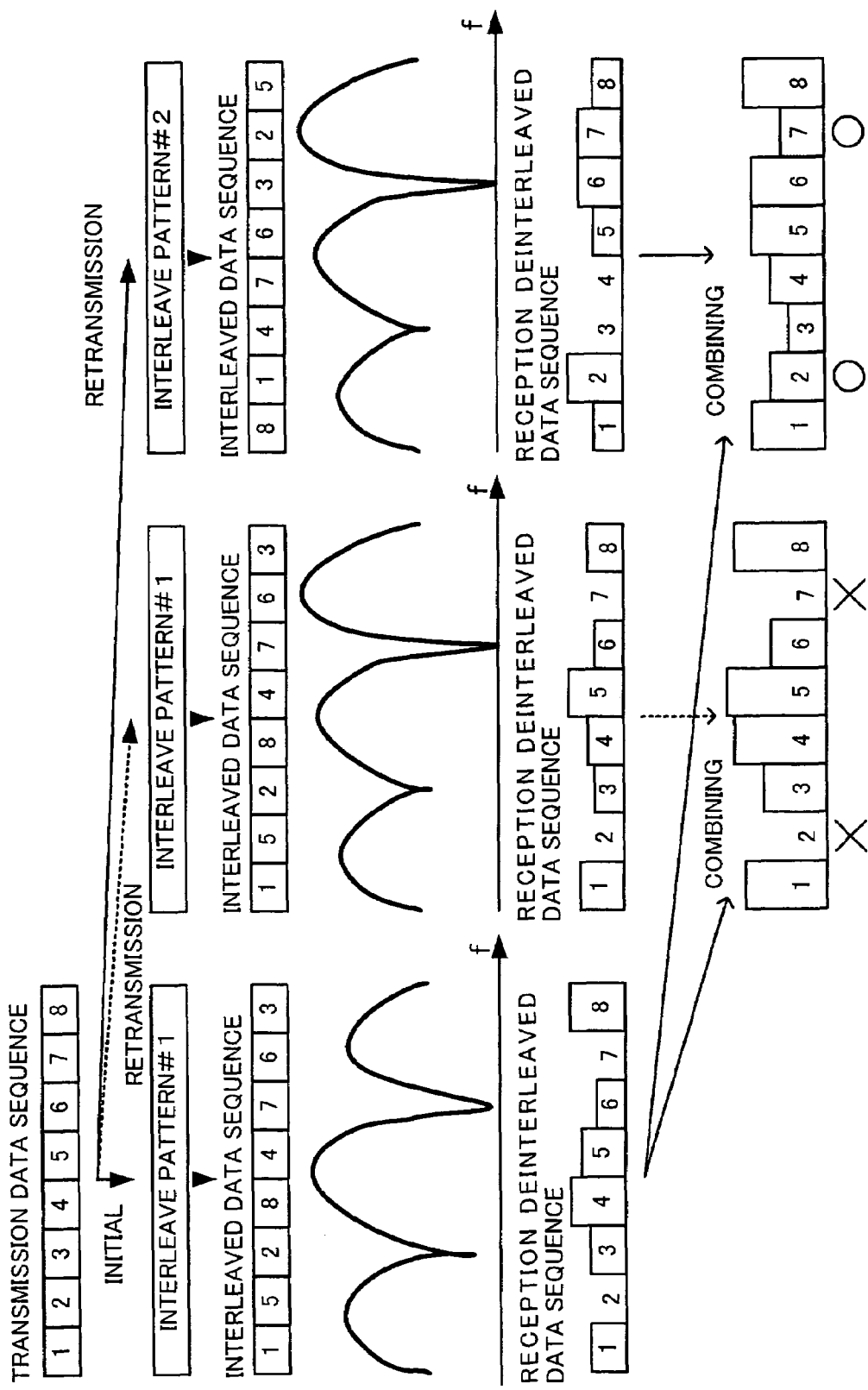
FIG. 11 is a view showing an explanation of an effect when bit interleave processing is performed with interleave patterns each being different for each retransmission.

Here, the following will briefly explain the reason why the error rate characteristic is improved by changing the subcarrier that locates the bits at the initial transmitting time and the retransmitting time using FIG. 11. When the same interleave pattern #1 is used at the initial transmitting time and the retransmitting time, the same data is placed on the same subcarrier at the initial transmitting time and the retransmitting time. For this reason, even if an initially transmitted signal and a retransmitted signal are combined, data allocated to the subcarrier whose reception level drops because of frequency-selective fading can hardly obtain diversity effect due to the retransmission. Data 2 and 7 indicated by X in the figure correspond to this.

On the other hand, when the same different interleave patterns #1 and #2 are used at the initial transmitting time and the retransmitting time, the same data is placed on the different subcarriers at the initial transmitting time and the retransmitting time. For this reason, when an initial transmission signal and a retransmission signal are combined, there is a high possibility that data, which was not able to obtain a sufficient reception level at the first transmission, will obtain a sufficient reception level at the second transmission. This results in obtaining diversity effect due to the retransmission. Data 2 and 7 indicated by ○ in the figure correspond to this.

Figure 12:
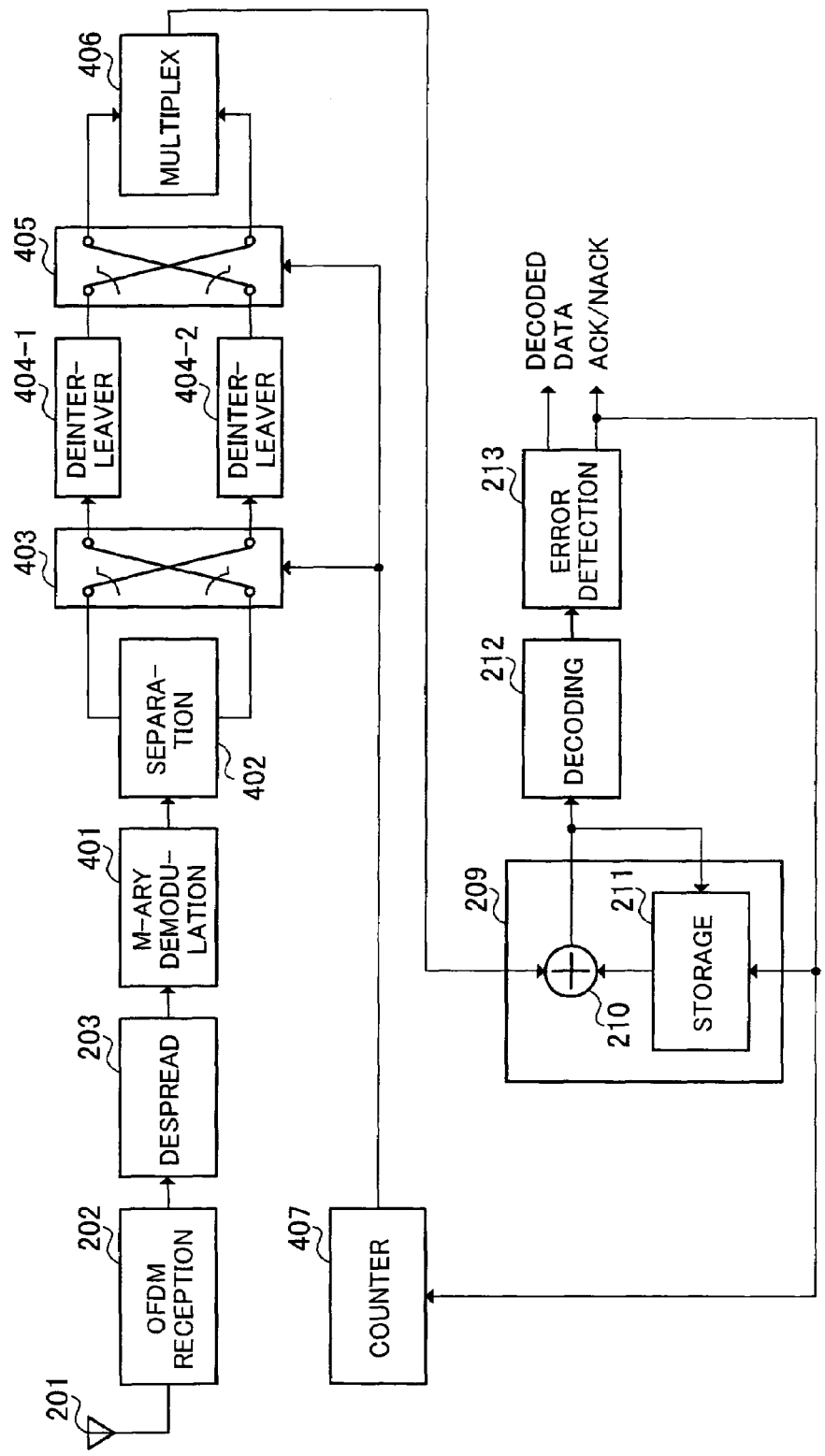
FIG. 12 is a block diagram illustrating a configuration of a multicarrier receiving apparatus of Embodiment 2.

FIG. 12 illustrates a configuration of a multicarrier receiving apparatus 400 that receives a signal transmitted from the multicarrier transmitting apparatus 300 (FIG. 7) and demodulates it. In FIG. 12 shown by adding the same reference numerals as those of FIG. 3 to the portions corresponding to FIG. 3, the multicarrier transmitting apparatus 400 inputs a despread signal to an M-ary demodulating section 401. Here, the M-ary demodulating section 401, a separating section 402, a selection circuit 403, deinterleavers 404-1, 404-2, a selection circuit 405, and a multiplexing section 406 perform basically reverse processing of the corresponding sections of the multicarrier transmitting apparatus 300.

More specifically, the M-ary demodulating section 401, the separating section 402, the selection circuit 403, the deinterleavers 404-1, 404-2, the selection circuit 405, and the multiplexing section 406 perform reverse processing of the M-ary demodulating section 107, the multiplexing 306, the selection circuit 304, the deinterleavers 303-1, 303-2, the selection circuit 302, and the separating section 301, respectively. Consequently, the same bit sequence as the bit sequence input to the separating section 307 (FIG. 7) except for deterioration in transmission is restored and output from the multiplexing section 406.

According to the aforementioned configuration, in addition to the fact that the M-ary modulated high-order bits and low-order bits are interchanged for each retransmission, the relevant high-order bits and low-order bits are interleaved with interleave patterns each being different for each retransmission and subcarriers that locate the bits are interchanged for each retransmission. This enables to further increase time diversity effect by retransmission in connection with each bit in addition to the effect of Embodiment 1. As a result, it is possible to improve the error rate characteristic after packet combining.

Moreover, by providing the separating section 301, the selection circuit 302, the interleavers 303-1, 303-2, the selection circuit 304, and the multiplexing section 306, it is possible to interchange the high-order bits and low-order bits for each retransmission and interchange bits forming one symbol for each retransmission without changing a configuration of constellation mapping of the M-ary modulating section 107. This enables to implement a simple apparatus configuration.

Embodiment 3

Figure 13:
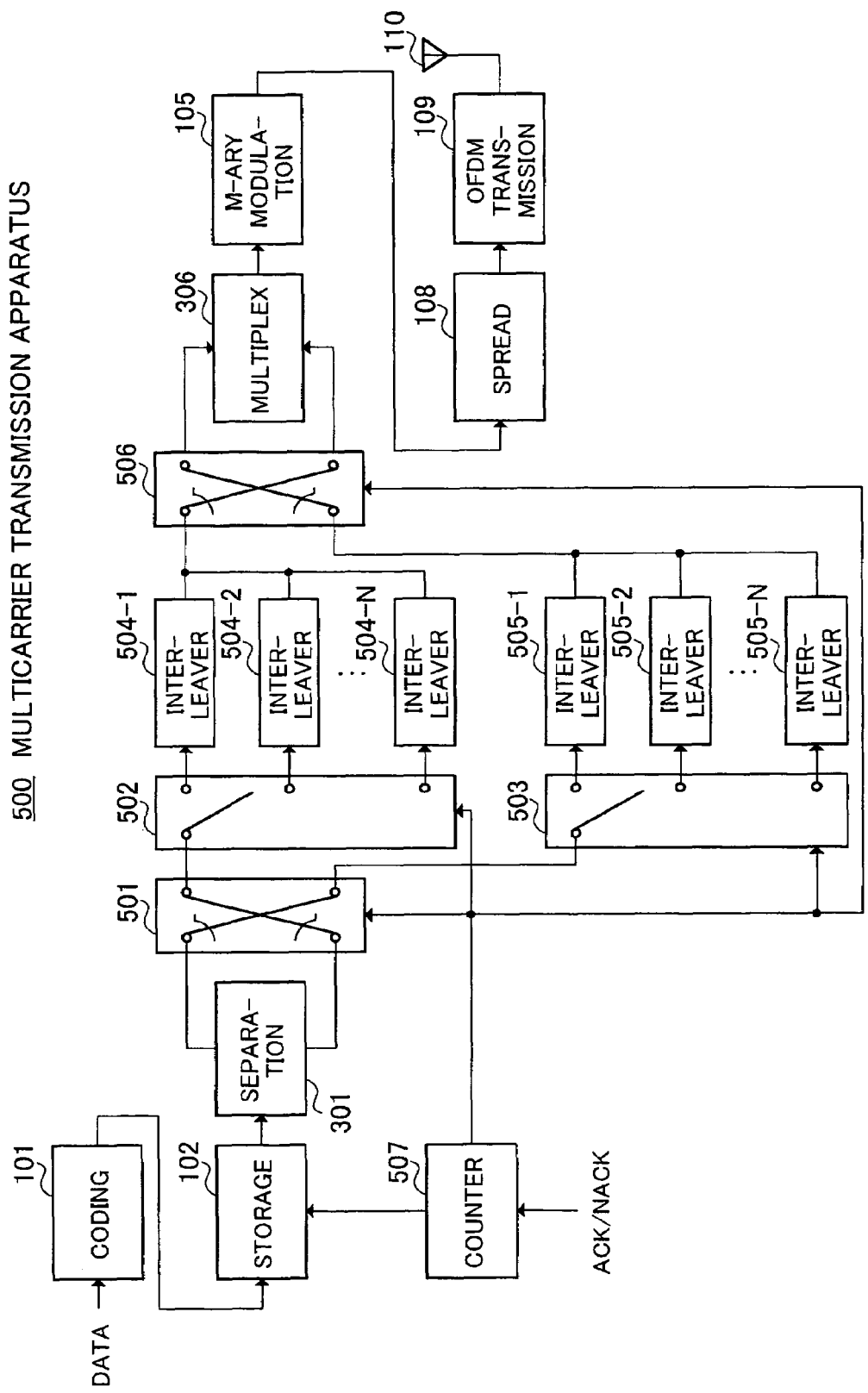
FIG. 13 is a block diagram illustrating a configuration of a multicarrier transmitting apparatus of Embodiment 3.

In FIG. 13 shown by adding the same reference numerals as those of FIG. 7 to the portions corresponding to FIG. 7, a multicarrier transmitting apparatus 500 of this embodiment interleaves the high-order bits and low-order bits separated by the separating section 301 with the respective independent interleave patterns. Since this enables to increase variations in the high-order bits and low-order bits greater compared to Embodiment 2, it is possible to further improve time diversity effect by retransmission in connection with each bit and more raise improvement effect of the bit error rate characteristic by retransmission.

More detailed explanation will be given as follows. The high-order bits and low-order bits separated by the separating section 301 are input to a selection section 501 and distributed to a selection section 502 and a selection circuit 503, respectively, according to a count value of a counter 507 (namely, the number of retransmissions) Interleavers 504-1, 504-2, ..., 504-N, each having a different interleave pattern, are provided to the output terminals of the selection section 502, and interleavers 505-1, 505-2, ..., 505-N, each having a different interleave pattern, are provided to the output terminals of the selection circuit 503.

Then, the selection circuits 502 and 503 select interleavers 504-1, 504-2, ..., 504-N, 505-1, 505-2, ..., 505-N that supply data according to the count value of the counter 507. Consequently, the high-order bits and low-order bits are interleaved with interleave patterns that are completely different from each other independently for each retransmission.

The interleaved high-order bits and low-order bits are input to the multiplexing section 306 through the selection section 506. At this time, in the same way as explained in Embodiment 2, the high-order bits and low-order bits input to the input terminals of the multiplexing section 306 through the selection section 506 are interchanged for each retransmission, so that the high-order bits and low-order bits to be handled by the M-ary modulating section 107 are interchanged for each retransmission.

Figure 14:
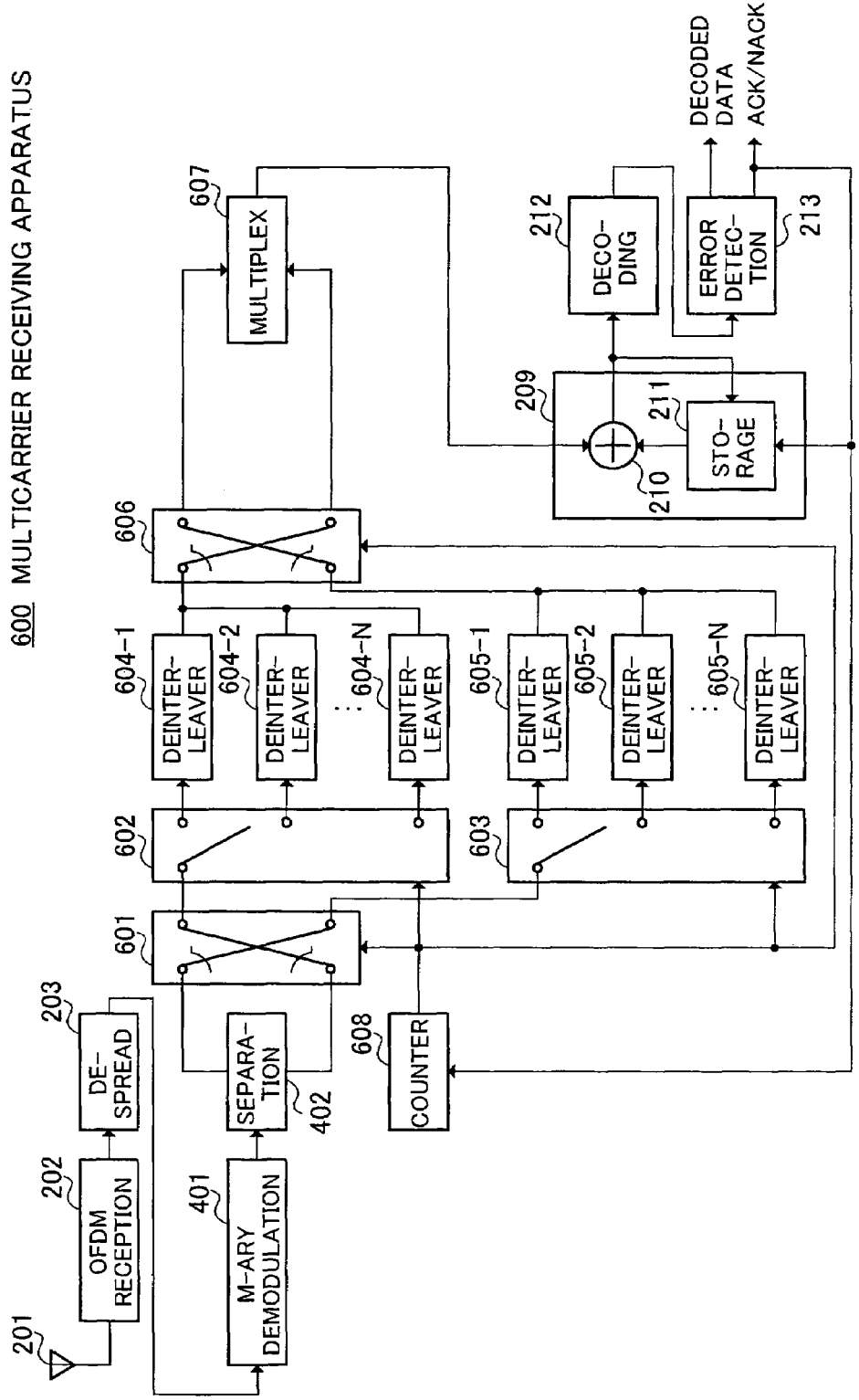
FIG. 14 is a block diagram illustrating a configuration of a multicarrier receiving apparatus of Embodiment 3.

FIG. 14 illustrates a configuration of a multicarrier receiving apparatus 600 that receives a signal transmitted from the multicarrier transmitting apparatus 500 and demodulates it. In FIG. 14 shown by adding the same reference numerals as those of FIG. 12 to the portions corresponding to FIG. 12, the multicarrier transmitting apparatus 600 inputs an M-ary modulated signal to the separating section 402. Here, the separating section 402, a selection section 601, a selection section 602, a selection section 603, deinterleavers 604-1, 604-2, ... 604-N, deinterleavers 605-1, 605-2, .... 605-N, a selection section 606, and a multiplexing section 607 perform basically reverse processing of the corresponding sections of the multicarrier transmitting apparatus 500.

More specifically, the separating section 402, the selection section 601, the selection section 602, the selection section 603, the deinterleavers 604-1, 604-2, ... 604-N, the deinterleavers 605-1, 605-2, ... 605-N, the selection circuit 606, and the multiplexing section 607 perform reverse processing of the multiplexing section 306, the selection section 506, the selection section 502, the selection section 503, the interleavers 504-1, 504-2, ... 504-N, the interleavers 505-1, 505-2, ... 505-N, the selection section 501, and the separating section 301, respectively. Consequently, the same bit sequence as the bit sequence input to the separating section 301 except for deterioration in transmission is output from the multiplexing section 607.

According to the aforementioned configuration, in addition to Embodiment 2, the high-order bits and low-order bits separated by the separating section 301 are interleaved with interleave patterns each being independent, thereby making it possible to increase variations in the high-order bits and low-order bits greater compared to Embodiment 2 and further improve time diversity effect by retransmission in connection with each bit. In other words, since the bits forming one M-ary modulated symbol are varied for each of the high-order bits and low-order bits by every retransmission, it is possible to reduce the probability that the reception level of the same bit will decrease even if the reception level of the same bit decreases at the previous transmission and the next transmission (retransmission). As a result, it is possible to more raise improvement effect of the bit error rate characteristic by retransmission.

Moreover, the high-order bits and low-order bits separated by the separating section 301 are interleaved with each independent interleave pattern, thereby enabling to easily restore each bit sequence on the receiving side. In other words, the receiving side can restore the original bit sequence by simply performing the reverse processing of the transmitting side for each of the high-order bits and low-order bits.

Additionally, in the aforementioned Embodiment 1, the high-order bits and low-order bits separated by the separating section 301 are interleaved with the interleave patterns each being independent of each other, thereby enabling to easily restore each bit sequence on the receiving side. In other words, the receiving side can restore the original bit sequence by simply performing reverse processing of the transmitting side for each of the high-order bits and low-order bits.

Additionally, the aforementioned Embodiment 1 explained the case in which the sequence converting section 104 was provided to perform interchange processing of the high-order bits and low-order bits at the M-ary modulating time every retransmission, and Embodiment 2 explained the case in which the separating section 301, the interleavers 303-1, 303-2, the selection section 304, and the multiplexing section 306 were provided to perform bit interleave processing that is different for each retransmission and perform interchange processing of the high-order bits and low-order bits. However, the present invention is not limited to this and the function of bit interleaving and the function of interchanging the high-order bits and low-order bits may be provided to the interleavers.

Figure 15:
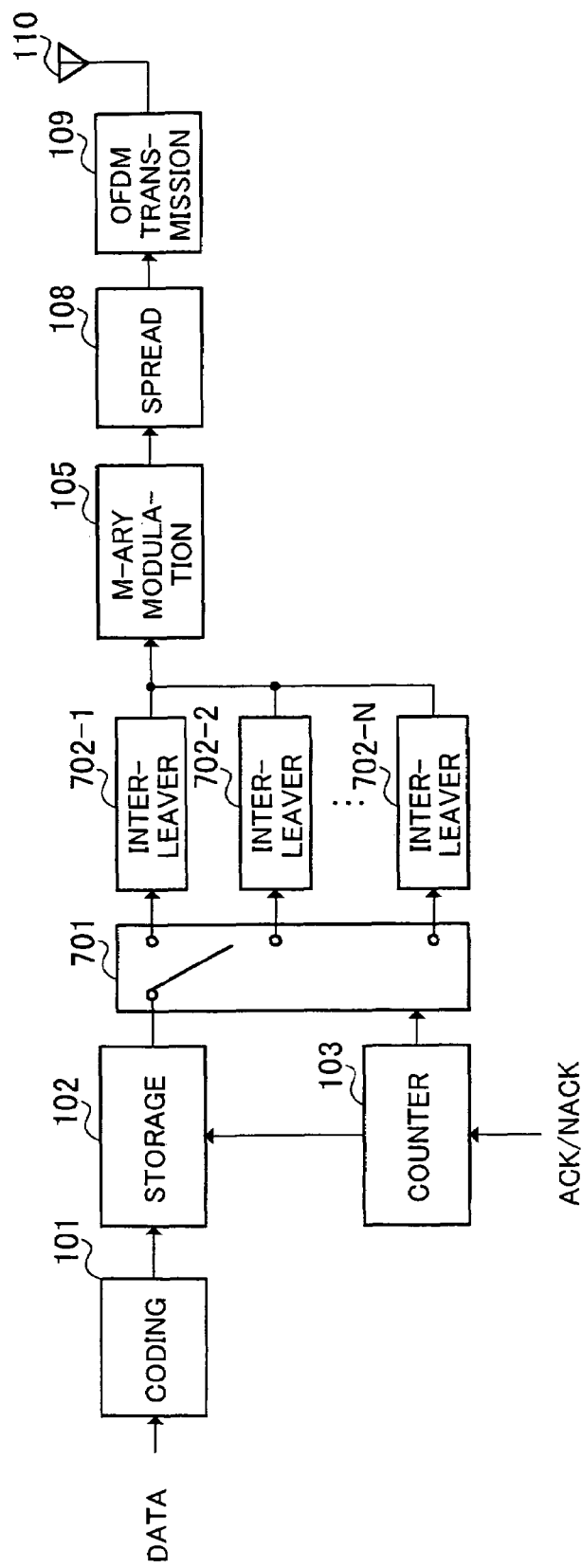
FIG. 15 is a block diagram illustrating a configuration of a multicarrier transmitting apparatus according to another embodiment.

For example, as illustrated in FIG. 15, by providing a plurality of interleavers 701-1, 701-2, ..., 702-N, each having the function of interchanging the high-order bits and low-order bits at the M-ary modulating time and a different interleave pattern, the same effect as explained in Embodiments 1 and 2 can be obtained.

Namely, in FIG. 15 shown by adding the same reference numerals as those of FIG. 1 to the portions corresponding to FIG. 1, a multicarrier transmitting apparatus 700 of this embodiment includes the plurality of interleavers 701-1, 701-2, ..., 702-N, each having the function of interchanging the high-order bits and low-order bits at the M-ary modulating time and a different interleave pattern. The multicarrier transmitting apparatus 700 selects any one of interleavers 701-1, 701-2, ..., 702-N to which transmission data is supplied according to the number of retransmissions using a selection circuit 701. This enables to achieve the same effect as explained in Embodiments 1 and 2 by the configuration as illustrated in FIG. 15.

Figure 16:
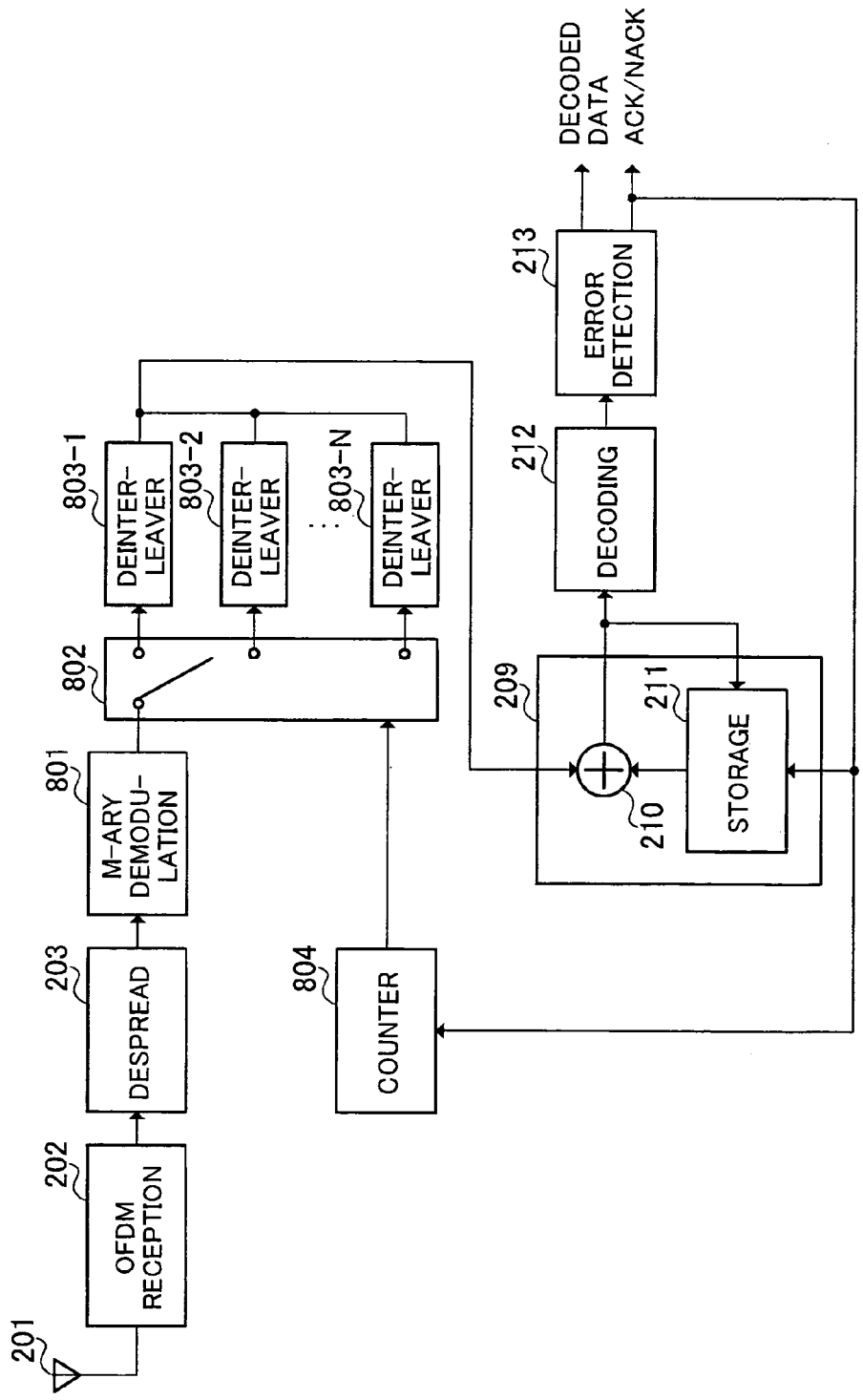
FIG. 16 is a block diagram illustrating a configuration of a multicarrier receiving apparatus according to another embodiment.

In addition, a multicarrier signal transmitted from the multicarrier transmitting apparatus 700 illustrated in FIG. 15 can be received and modulated by a multicarrier receiving apparatus 800 configured as in FIG. 16. In FIG. 16 shown by adding the same reference numerals as those of FIG. 3 to the portions corresponding to FIG. 3, the multicarrier receiving apparatus 800 inputs a signal demodulated by an M-ary demodulating section 801 to selection section 802. Here, a selecting section 802, deinterleavers 803-1, 803-2, ..., 803-N perform basically reverse processing of the corresponding sections of the multicarrier transmitting apparatus 700.

More specifically, the M-ary demodulating section 801, the selecting section 802, and the deinterleavers 803-1, 803-2, ..., 803-N perform reverse processing of the M-ary modulating section 107, the selecting section 701, and interleavers 702-1, 702-2, ..., 702-N, respectively. Consequently, the same bit sequence as the bit sequence input to the selecting section 701 on the transmitting side except for deterioration in transmission is output from the deinterleavers 803-1, 803-2, ..., 803-N.

Moreover, the aforementioned Embodiments 1 to 3 explained the case in which 16 QAM was used as M-ary modulation. However, the present invention is not limited to this, and may be applied to a case in which, for example, 64 QAM, 16 PSK and the like are used. To sum up, this may be widely applied to the case of using M-ary modulation in which high-order bits where a transmission error does not easily occur and low-order bits where a transmission error easily occurs are present.

Furthermore, regarding the configuration of OFDM transmitting section 109, although not specifically explained in the aforementioned Embodiments 1 to 3, the same effect as explained in the aforementioned embodiments can be obtained even if the spread chip is spread in a frequency axial direction or time axial direction. Still furthermore, the same effect can be obtained even in the multicarrier transmission that performs no spreading.

Moreover, the aforementioned Embodiments 1 to 3 explained the case in which the counter was provided on the receiving side to count a NACK signal, thereby detecting what number of the retransmission signals a currently received signal was. However, it is possible to detect what number of the retransmission signals the currently received signal is based on a transmission number signal sent from the transmitting side.

Furthermore, a detecting section that detects the reception level of each subcarrier is provided to the transmitting side or the receiving side and an interleave pattern is selected at the time of retransmission such that the same bit is prevented from being located on the subcarrier with a low reception level based on the detection result, thereby making it possible to surely prevent the reception level of the same bit from being decreased continuously at the previous transmission and the next transmission (retransmission), so that the error rate characteristic can be further improved.

Moreover, the aforementioned Embodiments 1 to 3 explained the case in which the present invention was implemented by hardware. However, the same function as the embodiments may be implemented by a program.

Embodiment 4

This embodiment proposes an apparatus and method that raises improvement effect of the bit error rate characteristic by retransmission when the multicarrier communication is combined with the multicarrier communication technique such as MIMO (MultiInput MultiOutput) and the like.

An explanation will be first given of the process in which the proposal of this embodiment was achieved. In the radio communication, there is a diversity technique as a technique that improves the error rate characteristic positively. The diversity technique is a technique that combines a plurality of received signals including the same information to improve the error rate characteristic.

As one of diversity techniques, there is transmission diversity. In the transmission diversity, a signal is transmitted to the same communication counterpart from two antennas (branches) whose fading correlation therebetween is low, thereby enabling to perform high quality reception by diversity effect without making the configuration of the apparatus on the receiving side complicated.

In the transmission diversity system that uses a plurality of transmission antennas (for example, STTD-Space Time Transmit Diversity), when fading correlation between the branches is high, diversity gains are reduced and the effect cannot be sufficiently obtained. Particularly, regarding a mobile apparatus, in consideration of the size of the enclosure, there is a high possibility of making it difficult to obtain such a location that the plurality of antennas is sufficiently spaced far apart, so that the aforementioned problem becomes apparent. Moreover, in an H-ARQ system that retransmits the same packet to be combined with the received packet when an error is detected in the packet by the receiving side, when the interval between retransmissions is short or the maximum Doppler frequency is low, fading correlation in a time direction becomes high and diversity gains cannot be sufficiently obtained at a packet combining time.

There is a conventional multicarrier communication apparatus that performs interleave processing for each burst signal to obtain substantially the same effect as obtained when a time interval is provided without putting the time interval more than necessary in a low-speed fading propagation path environment and a high transmission speed environment when a plurality of burst signals is transmitted in time series.

However, in the above example, since the interleave pattern is changed regardless of whether or not data is correctly received, even when data rearranged with the interleave pattern suitable for the propagation path environment is transmitted, data to be next transmitted can be rearranged with a different interleave pattern, so that there is a possibility that effect of interleave will not be sufficiently obtained.

Thus, in the conventional apparatus, there is a problem in which the diversity gains are reduced to generate a reception error on the grounds that the correlation between the branches is high or the retransmission interval is short, the maximum Doppler frequency is low, fading correlation in a time direction is high, and the like, with the result that a sufficient throughput cannot be obtained.

In view of these circumstances, the inventors of the present invention considered that when an error occurred in received data, the transmission diversity effect was not able to be improved even if transmission was performed with the same subcarrier, but the correlation differed at transmission diversity for each subcarrier and this could be used to improve the transmission diversity effect.

The feature of the present embodiment is that in the multicarrier communication to which transmission diversity (multiantenna) is applied, when an error occurs in received data, a subcarrier that transmits data is changed to perform retransmission, thereby increasing the chance that reduces the correlation between the branches to increase the diversity gains and improve a throughput.

Figure 17:
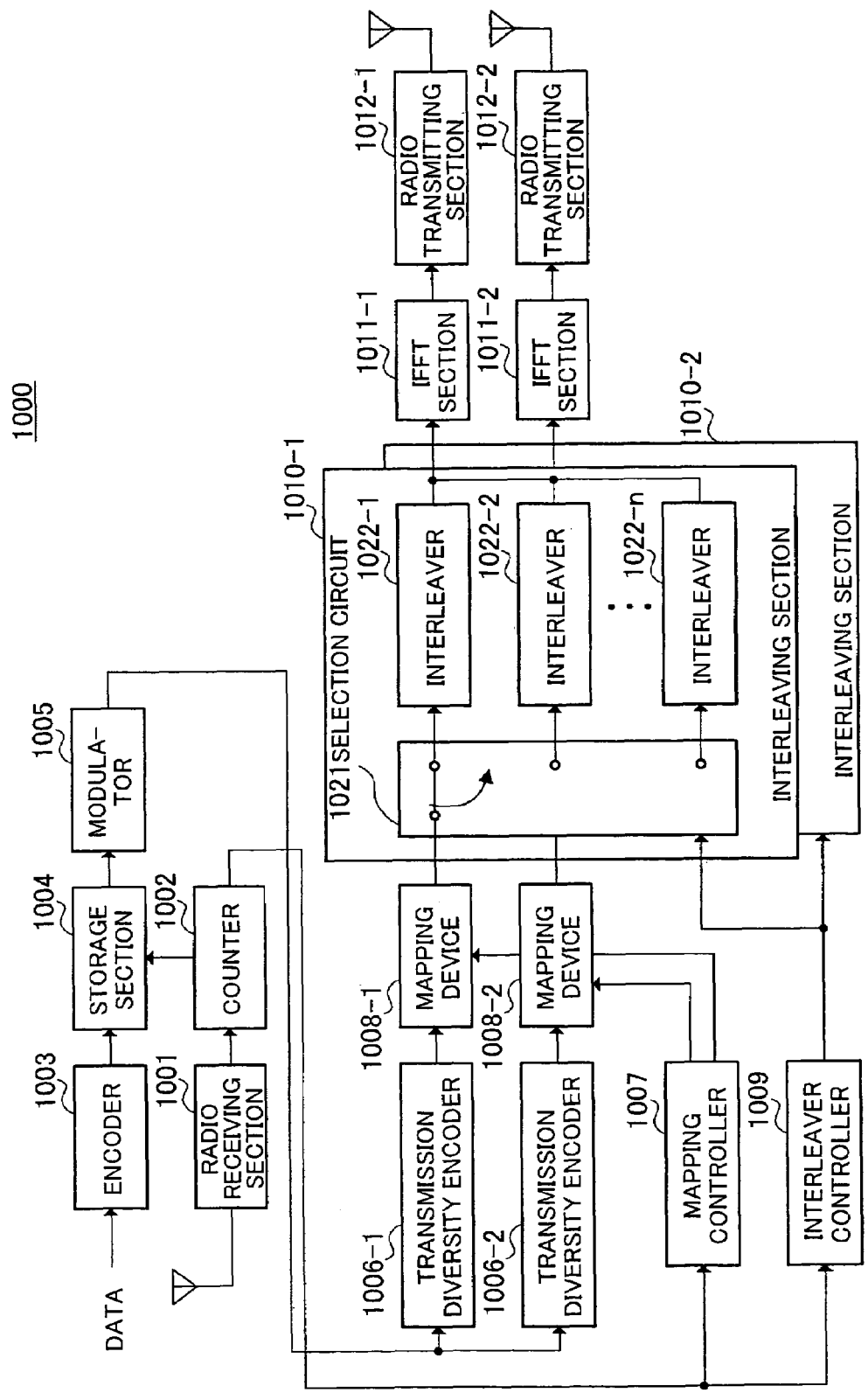
FIG. 17 is a block diagram illustrating a configuration of a transmission system of a multicarrier communication apparatus according to Embodiment 4.

FIG. 17 is a block diagram illustrating a configuration of a multicarrier communication apparatus according to Embodiment 4. A multicarrier communication apparatus 1000 of FIG. 17 includes a radio receiving section 1001, a counter 1002, an encoder 1003, a storage section 1004, a modulator 1005, a transmission diversity encoder 1006-1, a transmission diversity encoder 1006-2, a mapping controller 1007, a mapping device 1008-1, a mapping device 1008-2, an interleaver controller 1009, an interleave section 1010-1, an interleave section 1010-2, an IFFT section 1011-1, an IFFT section 1011-2, a radio transmitting section 1012-1, and a radio transmitting section 1012-2.

In FIG. 17, the radio receiving section 1001 converts a received radio signal to a baseband frequency to modulate, and extracts an ACK signal or NACK signal and output it to the counter 1002. The counter 1002 counts the number of times the NACK signal is received in unit of transmitting data, and outputs the number of times to the storage section 1004, the mapping controller 1007, and the interleaver controller 1009.

The encoder 1003 error correction coding on transmitting data and outputs it to the storage section 1004. The storage section 1004 stores coded data. Then, when receiving a counter value (for example, "1") indicating an initial transmission from the counter 1002, the storage section 1004 outputs next coded data to the modulator 1005. Moreover, when receiving a counter value (for example, a value except for "1") indicating a retransmission from the counter 1002, the storage section 1004 outputs previously stored data to the modulator 1005.

The modulator 1005 modulates data and outputs it to the transmission diversity encoder 1006-1 and the transmission diversity encoder 1006-2. The transmission diversity encoder 1006-1 directly outputs an input data sequence to the mapping device 1008-1. The transmission diversity encoder 1006-2 obtains a complex conjugate of data, rearranges the order of two adjacent symbols, performs computation of $X(-1)$ to one symbol, and outputs it to the mapping device 1008-2.

The mapping controller 1007 decides a subcarrier that maps data based on the number of times the NACA signal is received in unit of transmitting data, and directs it to the mapping device 1008-1 and the mapping device 1008-2. The subcarrier directed by the mapping controller 1007 differs depending on the number of times the NACK signal is received.

The mapping device 1008-1 maps phase and amplitude according to transmitting data to accommodate the subcarrier directed by the mapping controller 1007, and outputs the mapping values to the interleave section 1010-1. Similarly, the mapping device 1008-2 maps phase and amplitude according to transmitting data to accommodate the subcarrier directed by the mapping controller 1007, and outputs the mapping values to the interleave section 1010-2.

The interleaver controller 1009 directs an interleave pattern to the interleave section 1010-1 and the interleave section 1010-2 based on the number of times the NACK signal is received in unit of transmitting data. The interleave pattern directed by the interleaver controller 1009 differs depending on the number of times the NACK signal is received.

The interleave section 1010-1 includes a selection circuit 1021 and interleavers 1022-1 to 1022-n, and changes the interleave pattern to rearrange data according to instructions from the interleaver controller 1009. Then, the interleave section 1010-1 outputs the rearranged data to the IFFT section 1011-1.

The selection circuit 1021 outputs data to an interleaver of interleavers 1022-1 to 1022-n that performs rearranging with the interleave pattern corresponding to instructions from the interleaver controller 1009. The interleavers 1022-1 to 1022-n rearrange the order of data with different interleave patterns, and output rearranged data to the IFFT section 1011-1, respectively.

For example, the selection circuit 1021 outputs data to the interleaver 1022-1 at a first transmitting time, the selection circuit 1021 outputs data to the interleaver 1022-2 at a first retransmitting time, and the selection circuit 1021 outputs data to the interleaver 1022-3 at a second retransmitting time. Then, when success in data transmission is attained and next data is transmitted, the selection circuit 1021 outputs data again to the interleaver 1022-1.

Similarly, the interleave section 1010-2 changes the interleave pattern to rearrange data according to instructions from the interleaver controller 1009. Then, the interleave section 1010-2 outputs rearranged data to the IFFT section 1011-2.

The IFFT section 1011-1 orthogonally transforms data rearranged by the interleave section 1010-1 so as to transform data of the frequency domain into signal of the time domain, and outputs it to the radio transmitting section 1012-1. The IFFT section 1011-2 orthogonally transforms data rearranged by the interleave section 1010-2 so as to transform data of the frequency domain into signal of the time domain, and outputs it to the radio transmitting section 1012-2. For example, the IFFT section 1011-1 and IFFT section 1011-2 perform an inverse fast Fourier transform on data.

The radio transmitting section 1012-1 transforms a signal output from the IFFT section 1011-1 to a radio frequency and transmits it. Similarly, the radio transmitting section 1012-2 transforms a signal output from the IFFT section 1011-2 to a radio frequency and transmits it.

An explanation will be next given of an operation of a carrier change in the multicarrier communication apparatus according to this embodiment. FIGS. 18 to 23 are views each illustrating one example of a symbol array. In FIGS. 18 to 23, a vertical axis indicates a subcarrier frequency and a horizontal axis indicates time.

Figure 18:
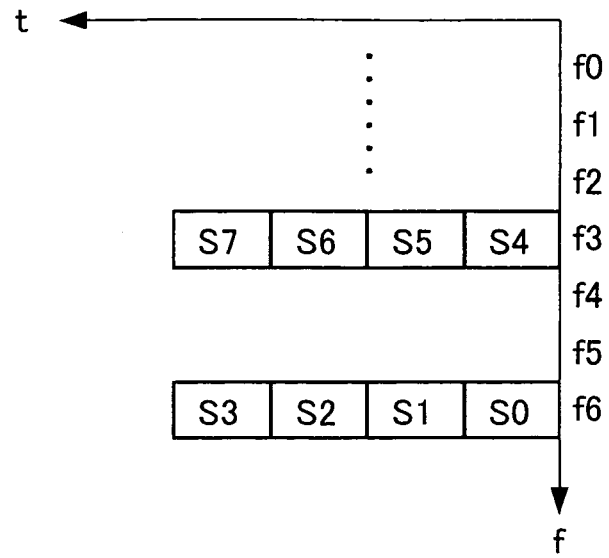
FIG. 18 is a view illustrating one example of a symbol array.
Figure 19:
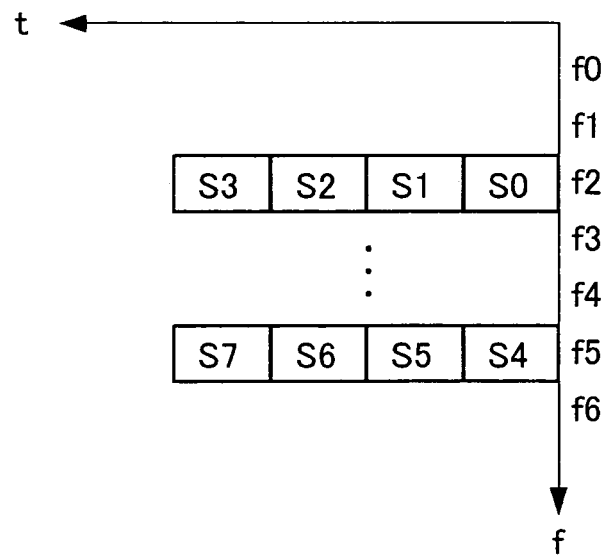
FIG. 19 is a view illustrating one example of a symbol array.
Figure 20:
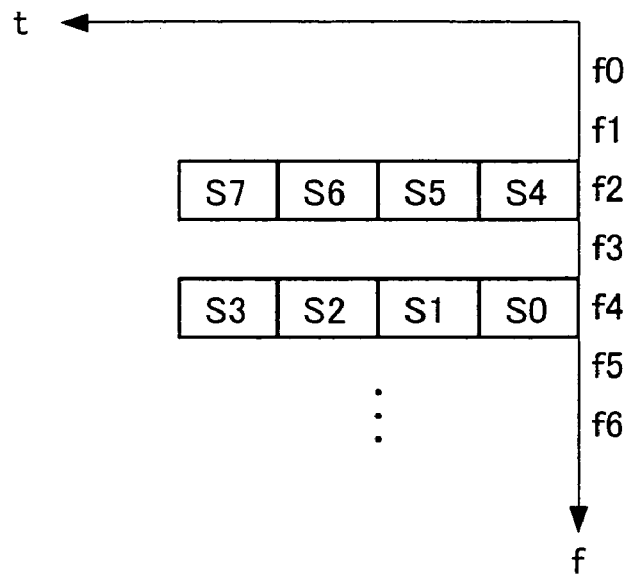
FIG. 20 is a view illustrating one example of a symbol array.
Figure 21:
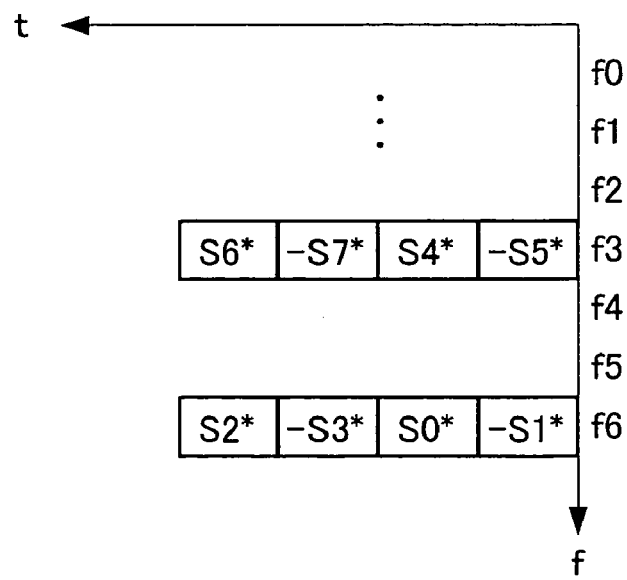
FIG. 21 is a view illustrating one example of a symbol array.
Figure 22:
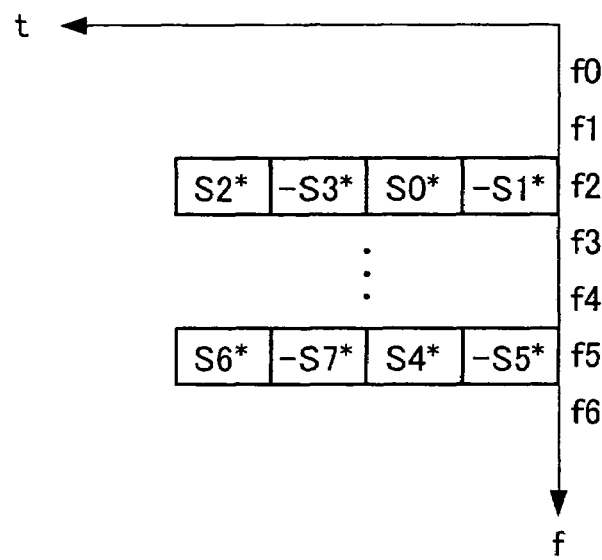
FIG. 22 is a view illustrating one example of a symbol array.
Figure 23:
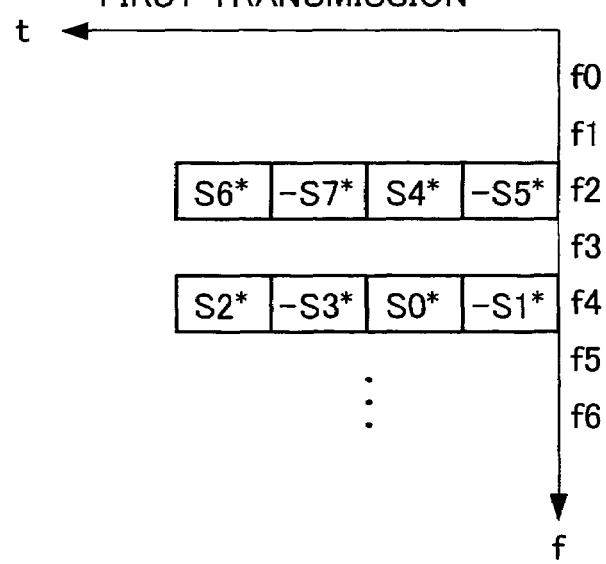
FIG. 23 is a view illustrating one example of a symbol array.

FIGS. 18, 19, and 20 are views each illustrating a symbol array transmitted from the radio transmitting section 1012-1. FIGS. 21, 22, and 23 are views each illustrating a symbol array transmitted from the radio transmitting section 1012-2. Here, it is assumed that a branch that transmits a signal from the radio transmitting section 1012-1 is a branch #1 and that a branch that transmits a signal from the radio transmitting section 1012-2 is a branch #2.

Moreover, FIGS. 18 and 21 are views each illustrating a symbol array when data is first transmitted. FIGS. 19 and 22 are views each illustrating a symbol array when the same data is retransmitted. Then, FIGS. 20 and 23 are views each illustrating a symbol array when a second retransmission is performed.

As illustrated in FIG. 18, when data is first sent, the multicarrier communication apparatus 1000 transmits symbols S0, S1, S2 and S3 in order by a subcarrier with a frequency f6 from the radio transmitting section 1012-1, and transmits symbols S4, S5, S6 and S7 in order by a subcarrier with a frequency f3 therefrom.

Moreover, as illustrated in FIG. 21, the multicarrier communication apparatus 1000 transmits symbols −S1*, S0*, −S3* and S2* in order by a subcarrier with a frequency f6 from the radio transmitting section 1012-1, and transmits symbols −S5*, S4*, −S7* and S6* in order by a subcarrier with a frequency f3 therefrom. These symbols −S1*, S0*, S3*, S2, −S5*, S4*, −S7* and S6* are complex conjugates of symbols S0, S1, S2, S3, S4, S5, S6 and S7, respectively, and symbols to which "−" is added are those to which computation of $X(-1)$ is provided.

Here, two branches #1 and #2 have a case in which the correlation therebetween is high and a case in which the correlation therebetween is low depending on the subcarrier to be transmitted. Then, when the correlation between the branches is high, transmission diversity effect cannot be sufficiently obtained.

For example, in a case where the correlation between the branches is high, which have the frequencies f3 and f6, respectively, when data is transmitted with the frequencies f3 and f6 and an error occurs, there is a high possibility that transmission diversity effect will not be sufficiently obtained and an error will occur again even if data is retransmitted with the frequencies f3 and f6.

For this reason, the multicarrier communication apparatus 1000 of this embodiment retransmits data using a subcarrier different from one used at the first data transmitting time when an error occurs on the receiving side. As illustrated in FIGS. 19 and 22, in the multicarrier communication apparatus 1000, data transmitted using the subcarrier with f3 is transmitted at f5 at the retransmitting time and data transmitted using the subcarrier with f6 is transmitted at f2 at the retransmitting time.

More specifically, the multicarrier communication apparatus 1000 transmits symbols S0, S1, S2 and S3 in order by the subcarrier with a frequency f2 from the radio transmitting section 1012-1, and transmits symbols S4, S5, S6 and S7 in order by the subcarrier with a frequency f5 therefrom. Moreover, symbols −S1*, S0*, −S3* and S2* are transmitted in order by the subcarrier with a frequency f2 from the radio transmitting section 1012-2 and symbols −S5*, S4*, −S7* and S6* are transmitted in order by the subcarrier with a frequency f5 therefrom.

Furthermore, in a case where an error occurs in received data even if data is retransmitted, the multicarrier communication apparatus 1000 of this embodiment further transmits data at a frequency different from the frequency of the subcarrier used at the retransmitting time. For example, as illustrated in FIGS. 20 and 23, data transmitted using the subcarrier with f2 is transmitted at f4 at the retransmitting time and data transmitted using the subcarrier with f5 is transmitted using the subcarrier at f2 at the retransmitting time.

Figure 24:
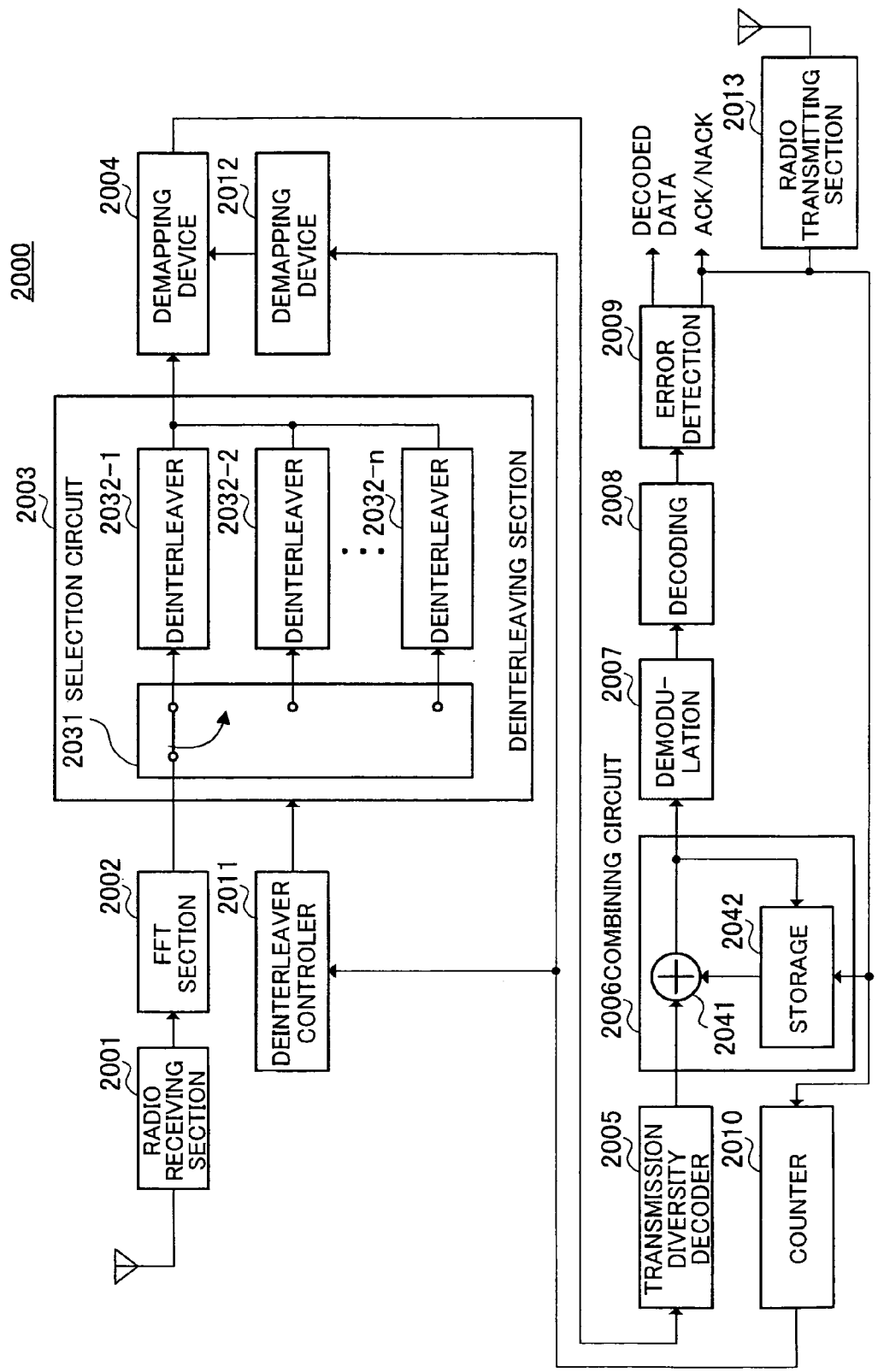
FIG. 24 is a block diagram illustrating a configuration of a receiving system of a multicarrier communication apparatus according to Embodiment 4.

An explanation will be next given of the receiving side. FIG. 24 is a block diagram illustrating a configuration of a receiving system of a multicarrier communication apparatus according to Embodiment 4. A multicarrier communication apparatus 2000 of FIG. 24 includes a radio receiving section 2001, an FFT section 2002, a deinterleave section 2003, a demapping device 2004, a transmission diversity decoder 2005, a combining circuit 2006, a demodulator 2007, a decoder 2008, an error detector 2009, a counter 2010, a deinterleaver controller 2011, a demapping controller 2012, and a radio transmitting section 2013.

The radio receiving section 2001 receives a radio signal to convert to a baseband frequency, and outputs the obtained baseband signal to the FFT section 2002. The FFT section 2002 orthogonally transforms the baseband signal so as to transform data of the frequency domain to data of the time domain, and outputs it to the deinterleave section 2003.

The deinterleave section 2003 includes a selection circuit 2031 and deinterleavers 2031-1 to 2032-n, changes a deinterleave pattern to rearrange data according to instructions from the deinterleaver controller 2011, and returns data transmitted by the multicarrier communication apparatus 1000 to the original order. Then, the deinterleave section 2003 outputs rearranged data to the demapping section 2004. The selection circuit 2031 outputs data to any one of the deinterleavers 2032-1 to 2032-n according to the number of NACK times. The deinterleavers 2032-1 to 2032-n rearrange the order of data with different deinterleave patterns, respectively.

The demapping device 2004 demaps rearranged data and transmits it to the transmission diversity decoder 2005. The transmission diversity decoder 2005 decodes demapped data and outputs it to the combining circuit 2006.

When data is stored and the data is retransmitted, the combining circuit 2006 combines data combing result up to the previous reception with the currently received data, and outputs it to the demodulator 2007. More specifically, the combining circuit 2006 includes a combining device 2041 and a storage section 2042. The combining section 2041 combines data output from the transmission diversity decoder 2005 with data stored in the storage section 2042, and outputs it to the storage section 2042 and the demodulator 2007. The storage section 2042 stores a symbol output from the combining device 2041. Moreover, when receiving an ACK signal from the error detector 2009, the storage section 2042 resets the storage contents.

The demodulator 2007 demodulates data and outputs it to the decoder 2008. The decoder 2008 decodes data and outputs it to the error detector 2009. The error detector 2009 detects whether there is an error in data. Then, when there is an error in data, the error detector 2009 transmits a NACK signal to the combining circuit 2006, the counter 2010 and the radio transmitting section 2013, and transmits an ACK when there is no error therein.

The counter 2010 counts the number of times the NACK signal is received for each data to be received, and outputs the number of times to the deinterleaver controller 2011 and the demapping controller 2012.

The deinterleaver controller 2011 directs a deinterleave pattern to the deinterleave section 2003 based on the number of times the NACK signal is received in unit of receiving data, namely, the number of times an error occurs in data. The deinterleave pattern directed by the deinterleaver controller 2011 differs depending on the number of times the NACK signal is received, and corresponds to a pattern that is used to deinterleave data interleaved by the interleaver controller 1009.

The demapping controller 2012 decides a subcarrier that demaps data based on the number of times the NACA signal is received in unit of transmitting data, and directs it to the demapping device 2004. The subcarrier directed by the demapping controller 2012 differs depending on the number of times the NACK signal is received, and corresponds to a mapping pattern directed by the mapping controller 1007. The radio transmitting section 2013 modulates the ACK signal or NACK signal to convert to a radio frequency, and transmits it.

Thus, according to the multicarrier communication apparatus according to this embodiment, in a case where transmission space diversity is performed using a plurality of antennas, when an error occurs in data received by the receiving side, a subcarrier to be transmitted by the transmitting side is changed to retransmit data, so that a correlation value between branches is changed for each retransmission to reduce an average of this correlation value, thereby making it possible to increase gains of transmission space diversity and improve the entire throughput of communication.

Moreover, according to the multicarrier communication apparatus according to this embodiment, when an error occurs in data received by the receiving side, an interleave pattern that is used to rearrange data to be transmitted by the transmitting side is changed to make it possible to reduce a fading correlation value in time at the time of retransmitting, so that diversity effect is increased to improve the entire throughput of communications.

Additionally, in the aforementioned explanation, the interleave pattern is fixed when data is rearranged at the first transmitting time, however, next data may be rearranged at the first transmitting time using the interleave pattern employed when success in data transmission was previously attained. For example, when correct data is transmitted at the second retransmission, next transmitting data is rearranged to perform first transmission using the interleave pattern employed at the second retransmission.

Thus, according to the multicarrier communication apparatus of this embodiment, next data may be rearranged at the first transmitting time using the interleave pattern employed when success in data transmission was previously attained, thereby enabling to transmit data using the interleave pattern suitable for the circumstances of the propagation path and improve the entire throughput of communication under even an environment where a burst error occurs.

Additionally, in the aforementioned explanation, in processing for orthogonally transforming data so as to transform data of the frequency domain to a signal of the time domain, a fast Fourier transform is used, however, any transform may be used if an orthogonal transform is used. For example, a discrete cosine transform, a discrete Fourier transform, and the like may be used.

Moreover, the number of branches of the transmission diversity is not limited to two, and any number of branches may be possible if multiple branches are used.

Furthermore, the multicarrier communication apparatus 2000 is configured such that the counter 2010 is provided to count the number of transmissions. However, such a configuration may be possible that the number of transmissions of the relevant transmitting data is sent to the multicarrier communication apparatus 2000 from the multicarrier communication apparatus 1000.

Moreover, in a system that performs no retransmission and circumstances where a propagation environment is so good that no retransmission is needed, even if a fixed interleaver is used, the correlation between the branches is reduced by the mapping of this embodiment to make it possible to obtain transmission diversity effect.

Still moreover, the multicarrier communication apparatus 2000 is configured such that packet combining is performed by the combining circuit 2006 at the retransmitting time and thereafter modulation is performed by the demodulator 2007. However, such a configuration may be possible that modulation is performed by the demodulator 2007 and thereafter demodulated outputs are combined by the combing circuit 2006.

Furthermore, the present invention is not limited to the aforementioned embodiments and various modifications may be implemented. For example, the aforementioned embodiments explained the case in which the respective functions were implemented by a hardware configuration. However, the present invention is not limited to these, and the aforementioned multicarrier communication method may be executed as software.

For example, a program that executes the aforementioned multicarrier communication method is prestored in a ROM (Read Only Memory) and the program may be operated by a CPU (Central Processor Unit).

Moreover, the program that executes the aforementioned multicarrier communication method is stored in a computer readable storage medium, the program stored in the storage medium is recoded on a RAM (Random Access Memory) of the computer, and the computer may be operated according to the program.

(1) The multicarrier communication apparatus of a first aspect of the present invention adopts a configuration including an M-ary modulating section that modulates transmission data with three or more bits to one symbol, a bit interchanging section that interchanges high-order bits and low-order bits for each retransmission when M-ary modulation processing is performed by the M-ary modulating section, and a multicarrier transmitting section that superimposes a symbol obtained by the M-ary modulating section on a plurality of subcarriers to transmit.

According to this configuration, since the low-order bits where an error easily occurs at a previous transmission are used as the high-order bits where an error does not easily occur at a next transmission (retransmission), it is possible to prevent the quality of the low-order bits from being continuously degraded when a modulated symbol is demodulated by a receiving side. As a result, time diversity effect by retransmission can be obtained in connection with each bit, and an error rate of the combined packet data is improved.

(2) The multicarrier communication apparatus of a second aspect of the present invention adopts a configuration further including an interleaver that interleaves bits to which M-ary modulation is unperformed with an interleave pattern being different for each retransmission in the above item.

According to this configuration, since bits forming M-ary modulated one symbol differ for each retransmission, it is possible to reduce a probability that the reception level of the same bit will continuously decrease even if the reception level of the same symbol decreases at a previous transmission and a next transmission (retransmission). As a result, it is possible to more improve time diversity effect by retransmission in connection with each bit.

(3) The multicarrier communication apparatus of a third aspect of the present invention adopts a configuration wherein the interleaver interleaves high-order bits and low-order bits with an independent interleave pattern for each retransmission, respectively in the above item (2).

According to this configuration, since bits forming one M-ary modulated symbol are varied for each of the high-order bits and low-order bits every retransmission, it is possible to reduce a probability that the reception level of the same bit will decrease even if the reception level of the same symbol decreases at a previous transmission and a next transmission (retransmission). In addition to this, the receiving side is facilitated to restore each bit sequence at ease. Namely, the transmitting side can perform such processing that surely interchanges the high-order bits and low-order bits to interleave each bit, and the receiving side simply performs the reverse processing to make it possible to restore the bit sequence to the original.

(4) The multicarrier communication apparatus of a fourth aspect of the present invention adopts a configuration further including a bit separating section that separates transmission data having a bit sequence of one system into bit sequences of two systems, a plurality of interleavers that interleaves the separated bit sequences of the respective systems with interleave patterns each being different for each retransmission, and a multiplexing section that rearranges the order of the interleaved bit sequences of the respective systems to perform time division multiplexing, wherein the M-ary modulating section modulates the bit sequences multiplexed by the multiplexing section in the above item (1).

According to this configuration, it is possible to easily perform such processing that interchanges the high-order bits and low-order bits for each retransmission and interchanges bits forming one symbol for each retransmission without changing the configuration of constellation mapping of the M-ary modulating section.

(5) The multicarrier communication apparatus of a fifth aspect of the present invention adopts a configuration further including a detecting section that detects a reception level of each subcarrier, wherein the interleaver selects such an interleave pattern that prevents the same bit from being located on a subcarrier with a low reception level based on the detection result in the above items (2) to (4).

According to this configuration, it is possible to surely prevent a probability that the reception level of the same bit will continuously decrease at a previous transmission and a next transmission (retransmission).

(6) The multicarrier communication apparatus of a sixth aspect of the present invention adopts a configuration further including an interleaver that interleaves the symbol obtained by the M-ary modulating section with an interleave pattern being different for retransmission, wherein the multicarrier transmitting section superimposes the interleaved symbol on the plurality of subcarriers to transmit in the above items (1) to (4).

According to this configuration, since it is possible to prevent the reception level of the same symbol from being reduced at a previous transmission and a next transmission (retransmission), a probability that the reception level of the same bit will continuously decrease can be further reduced as compared with the above cases (1) to (4).

(7) A multicarrier communication apparatus of a seventh aspect of the present invention is a multicarrier communication apparatus that receives and demodulates a multicarrier signal transmitted from the multicarrier communication apparatus of the above item (2), and adopts a configuration including a transmission symbol extracting section that extracts a transmission symbol from the received multicarrier signal, a demodulating section that performs soft decision on the extracted symbol to restore transmission bits, a deinterleaver that performs reverse processing of the interleaver of the above item (2) to the bit sequences obtained by the demodulating section for each retransmission, a bit rearranging section that returns the bit sequences interchanged by the interchanging section of the above item (2) to the original, and a combining section that performs packet combining using the bit sequences returned to the original for each retransmission.

According to this configuration, bit interleaving is performed for each retransmission by the transmitting side and the bits where the high-order bits and low-order bits are interchanged are returned to the original order, thereby making it possible to restore original transmission data satisfactorily.

(8) A multicarrier transmission method of an eighth aspect of the present invention includes the M-ary modulating step of modulating transmission data with three bits or more to one symbol, the bit interchanging step of interchanging high-order bits and low-order bits for each retransmission upon modulation processing in the M-ary modulation step, and the multicarrier transmitting step of superimposing the symbol obtained in the M-ary modulating on a plurality of subcarriers to transmit.

According to this method, since the low-order bits where an error easily occurs at a previous transmission are used as the high-order bits where an error does not easily occur at a next transmission (retransmission), it is possible to prevent the quality of the low-order bits from being continuously degraded when a modulated symbol is demodulated by a receiving side. As a result, time diversity effect by retransmission can be obtained in connection with the respective bits, and an error rate of the combined packet data is improved.

(9) A multicarrier communication apparatus of a ninth aspect of the present invention is a multicarrier communication apparatus that transmits a multicarrier signal from a plurality of different antennas, and adopts a configuration including a mapping section that maps data on a subcarrier being different from a subcarrier mapped at a first transmission to change a correlation between signals transmitted from the plurality of antennas at the time of retransmitting the data, and a transmitting section that transmits data mapped on the subcarrier by the mapping section from the plurality of antennas.

According to this configuration, a correlation value between the branches is changed at the first transmission and the retransmission to reduce an average of the correlation value, thereby making it possible to increase gains of transmission space diversity and improve the entire throughput of communications.

(10) The multicarrier communication apparatus of a tenth aspect of the present invention adopts a configuration including a transmission diversity encoding section that obtains complex conjugates of transmitting data to rearrange the order of symbols of one complex conjugate data to execute a predetermined computation to one symbol, wherein the transmitting section transmits complex conjugate data from the different antennas, respectively.

According to this configuration, in the communications using time space diversity, it is possible to increase gains of diversity and improve the entire throughput of communications.

(11) The multicarrier communication apparatus of an eleventh aspect of the present invention adopts a configuration including an interleaving section that rearranges data with different interleave patterns each corresponding to the number of retransmissions, wherein the transmitting section transmits rearranged data.

According to this configuration, when an error occurs in data received by the receiving side, the interleave pattern with which transmitting data is rearranged by the transmitting side is changed, thereby making it possible to reduce a fading correlation at the retransmitting time and increase time diversity effect, so that the entire throughput of communications can be improved.

(12) The multicarrier communication apparatus of a twelfth aspect of the present invention adopts a configuration wherein the interleaving section uses the interleave pattern, which was employed when data was correctly transmitted, so as to rearrange data to be next transmitted.

According to this configuration, the interleave pattern with which success in data transmission was previously attained is used when next data is first transmitted to rearrange, thereby making it possible to transmit data using the interleave pattern suitable for circumstances of a propagation path and improve the entire throughput of communication under even an environment where a burst error occurs.

(13) A multicarrier communication method of a thirteenth aspect of the present invention comprising the steps of:

at a transmitting side, mapping data on a subcarrier being different from a subcarrier on which data was mapped at a first transmission when data is retransmitted; and transmitting the data from a plurality of different antennas;

at a receiving side, demapping data received at the retransmitting time on a subcarrier being different from the first received data.

According to this method, a correlation value between the branches is changed at the first transmission and the retransmission to reduce an average of the correlation value, thereby making it possible to increase gains of transmission space diversity and improve the entire throughput of communications.

As explained above, according to the present invention, when M-ary modulation is provided to transmission data and modulated symbol is multicarrier transmitted, high-order bits where an error easily occurs and low-order bits where an error does not easily occur are interchanged for each retransmission and M-ary modulation is provided thereto, and bit interleave processing is performed such that bits forming one symbol differ for each retransmission, thereby making it possible to implement a multicarrier communication apparatus and method that can improve an error rate characteristic by retransmission.

Furthermore, in the case where multicarrier communication is performed using a plurality of antennas, when an error occurs in received data, a subcarrier that transmits data is changed to perform retransmission, thereby making it possible to boost the chance that reduces the correlation between the branches and increase the diversity gains at the time of transmission and packet combining concurrently, so that the throughput characteristic can be improved.

This application is based on Japanese Patent Application No. 2002-111171 filed on Apr. 12, 2002 and Japanese Patent Application No. 2002-273569 filed on Sep. 19, 2002, entire content of which is expressly incorporated by reference herein.

INDUSTRIAL APPLICABILITY

The present invention can be applied to a radio base station apparatus and a communication terminal apparatus that perform multicarrier communications such as an OFDM (Orthogonal Frequency Division Multiplexing) and the like.

The invention claimed is:

1. A multicarrier communication apparatus comprising:
a bit separation section that separates transmission data having a bit sequence of one system into bit sequences of two systems;
a plurality of interleavers that interleave the separated bit sequences of the respective systems with interleave patterns each being different for each retransmission;
a bit sequence supplying section that supplies the separated bit sequences of the respective systems to the interleavers each being different for each retransmission;
a bit interchanging section that interchanges an order of high-order bits and low-order bits for each retransmission when modulation processing is performed on the interleaved bit sequences of the respective systems;
a multiplexing section that performs time division multiplexing on the bit sequences of the respective systems where the order of the high-order bits and the low-order bits is interchanged;
an M-ary modulating section that performs the modulation processing of modulating the transmission data with three bits or more multiplexed by said multiplexing section to one symbol; and
a multicarrier transmitting section that superimposes the symbol obtained by said M-ary modulating section on a plurality of subcarriers to transmit.

2. The multicarrier communication apparatus according to claim 1, further comprising:
a detecting section that detects a reception level of each subcarrier, wherein:
said interleavers select such an interleaver pattern that prevents the same bit from being located on a subcarrier with a low reception level based on the detection result.

3. The multicarrier communication apparatus according to claim 1, further comprising:
an interleaver that interleaves the symbol obtained by said M-ary modulating section with an interleave pattern being different for retransmission, wherein
said multicarrier transmitting section superimposes the interleaved symbol on the plurality of subcarriers to transmit.

4. A multicarrier communication apparatus that receives and demodulates a multicarrier signal transmitted from the multicarrier communication apparatus described in claim 1, further comprising:
a symbol extracting section that extracts a transmission symbol from the received multicarrier signal;
a demodulating section that performs soft decision on the extracted symbol to restore transmission bits;
a deinterleaver that performs reverse processing of said interleaver to bit sequences obtained by said demodulating section for each retransmission;
a bit rearranging section that returns the bit sequences interchanged by said interchanging section to the original; and
a combining section that performs packet combining using the bit sequences returned to the original for each retransmission.

5. A multicarrier communication method comprising:
a bit separating step of separating transmission data having a bit sequence of one system into bit sequences of two systems;
an interleaving step of interleaving the separated bit sequences of the respective systems using interleavers having interleave patterns each being different for each retransmission;
a bit sequence supplying step of supplying the separated bit sequences of the respective systems to the interleavers each being different for each retransmission;
a bit interchanging step of interchanging an order of high-order bits and low-order bits for each retransmission when modulation processing is performed on the interleaved bit sequences of the respective systems;
a multiplexing step of performing time division multiplexing on the bit sequences of the respective systems where the order of the high-order bits and the low-order bits is interchanged;
an M-ary modulating step of performing the modulation processing of modulating the transmission data with three bits or more multiplexed by said multiplexing step to one symbol; and
a multicarrier transmitting step of superimposing the symbol obtained in said M-ary modulating step on a plurality of subcarriers to transmit.

* * * * *